US012262576B2

(12) United States Patent
Park et al.

(10) Patent No.: US 12,262,576 B2
(45) Date of Patent: *Mar. 25, 2025

(54) DISPLAY DEVICE HAVING STACK OF PLURALITY OF LIGHT EMITTING LAYERS, WAVELENGTH CONVERSION PATTERN, AND REFLECTIVE LAYER

(71) Applicant: Samsung Display Co. Ltd., Yongin-si (KR)

(72) Inventors: Kyoung Won Park, Seoul (KR); Sung Woon Kim, Yongin-si (KR); Soo Dong Kim, Hwaseong-si (KR); Jin Won Kim, Suwon-si (KR); Min Ki Nam, Incheon (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/402,294

(22) Filed: Jan. 2, 2024

(65) Prior Publication Data

US 2024/0138176 A1 Apr. 25, 2024
US 2024/0237386 A9 Jul. 11, 2024

Related U.S. Application Data

(63) Continuation of application No. 17/884,142, filed on Aug. 9, 2022, now Pat. No. 11,903,229, which is a
(Continued)

(30) Foreign Application Priority Data

Sep. 17, 2018 (KR) ......................... 10-2018-0110906

(51) Int. Cl.
*H10K 50/13* (2023.01)
*H01L 27/146* (2006.01)
(Continued)

(52) U.S. Cl.
CPC ....... *H10K 50/13* (2023.02); *H01L 27/14621* (2013.01); *H10K 50/125* (2023.02);
(Continued)

(58) Field of Classification Search
CPC ........ H01L 27/14609; H01L 27/14621; H10K 50/125; H10K 50/13; H10K 50/131;
(Continued)

(56) References Cited

U.S. PATENT DOCUMENTS 6,107,734 A 8/2000 Tanaka et al.
6,337,492 B1 1/2002 Jones et al.
(Continued)

FOREIGN PATENT DOCUMENTS

CN 106405918 2/2017
CN 108346681 7/2018
(Continued)

OTHER PUBLICATIONS

Extended European Search Report corresponding to European Application or Patent No. 19196813.0 dated Apr. 23, 2020.

*Primary Examiner* — Cheung Lee
(74) *Attorney, Agent, or Firm* — KILE PARK REED & HOUTTEMAN PLLC

(57) ABSTRACT

A display device includes first and second light emitting regions; first and second pixel electrodes in the first and second light emitting regions, respectively; a first organic layer in the first light emitting region, including first and second light emitting layers; a second organic layer in the second light emitting region, including a third light emitting layer; a common electrode on the first and second organic layers; a wavelength conversion pattern on the common electrode, overlapping the first organic layer, and wavelength-converting light of a first color into light of a second color, different from the first color; and a light transmitting
(Continued)

pattern on the common electrode, overlapping the second organic layer. The third light emitting layer and one of the first and second light emitting layers emit light of the first color, and another one of the first and second light emitting layers emits light of the second color.

19 Claims, 24 Drawing Sheets

Related U.S. Application Data continuation of application No. 17/148,756, filed on Jan. 14, 2021, now Pat. No. 11,444,258, which is a continuation of application No. 16/507,954, filed on Jul. 10, 2019, now Pat. No. 10,916,722.

(51) Int. Cl.
    *H10K 50/125*     (2023.01)
    *H10K 50/81*     (2023.01)
    *H10K 50/82*     (2023.01)
    *H10K 50/858*     (2023.01)
    *H10K 59/30*     (2023.01)
    *H10K 59/32*     (2023.01)
    *H10K 59/35*     (2023.01)
    *H10K 59/38*     (2023.01)

(52) U.S. Cl.
    CPC ............ *H10K 50/81* (2023.02); *H10K 50/82* (2023.02); *H10K 50/858* (2023.02); *H10K 59/30* (2023.02); *H10K 59/32* (2023.02); *H10K 59/35* (2023.02); *H10K 59/38* (2023.02)

(58) Field of Classification Search
    CPC ...... H10K 50/81; H10K 50/816; H10K 50/82; H10K 50/858; H10K 59/122; H10K 59/30; H10K 59/32; H10K 59/35; H10K 59/351; H10K 59/38; H10K 59/877; H10K 59/879; H10K 59/8792; H10K 2102/331; H10L 27/14621
    See application file for complete search history.

(56) References Cited

U.S. PATENT DOCUMENTS

| | | |
|---|---|---|
| 6,995,509 B2 | 2/2006 | Yamazaki et al. |
| 7,075,231 B1 | 7/2006 | Liao et al. |
| 7,192,659 B2 | 3/2007 | Ricks et al. |
| 7,977,872 B2 | 7/2011 | Spindler et al. |
| 8,057,916 B2 | 11/2011 | Hatwar et al. |
| 8,294,142 B2 | 10/2012 | Nishimura et al. |
| 8,536,569 B2 | 9/2013 | Yamazaki et al. |
| 8,796,676 B2 | 8/2014 | Pieh et al. |
| 8,847,216 B2 | 9/2014 | Kim et al. |
| 8,895,969 B2 | 11/2014 | Kim et al. |
| 8,981,393 B2 | 3/2015 | Seo et al. |
| 9,735,386 B2 | 8/2017 | Xue |
| 2007/0200492 A1 | 8/2007 | Cok et al. |
| 2015/0090992 A1 | 4/2015 | Miyazawa et al. |
| 2016/0028036 A1 | 1/2016 | Xue |
| 2016/0293676 A1 | 10/2016 | Komatsu |
| 2017/0194387 A1 | 7/2017 | Oh et al. |
| 2017/0269435 A1 | 9/2017 | Yoon et al. |
| 2018/0190921 A1 | 7/2018 | Liao |
| 2018/0211979 A1 | 7/2018 | Lee et al. |

FOREIGN PATENT DOCUMENTS

| | | |
|---|---|---|
| EP | 3 355 357 | 8/2018 |
| KR | 10-2015-0039112 | 4/2015 |
| KR | 10-2017-0031613 | 3/2017 |
| KR | 10-2017-0051614 | 5/2017 |
| KR | 10-2017-0080923 | 7/2017 |
| KR | 10-2017-0108192 | 9/2017 |
| KR | 10-2017-0111700 | 10/2017 |
| KR | 10-2018-0018969 | 2/2018 |
| KR | 10-2018-0079104 | 7/2018 |
| KR | 10-2018-0087908 | 8/2018 |
| WO | 2015/072143 | 3/2017 |

DISPLAY DEVICE HAVING STACK OF PLURALITY OF LIGHT EMITTING LAYERS, WAVELENGTH CONVERSION PATTERN, AND REFLECTIVE LAYER

CROSS-REFERENCE TO RELATED APPLICATION(S)

This is a continuation application of U.S. patent application Ser. No. 17/884,142 filed Aug. 9, 2022, now U.S. Pat. No. 11,903,229 issued Feb. 13, 2024, the disclosure of which is incorporated herein by reference in its entirety. U.S. patent application Ser. No. 17/884,142 is a continuation application of U.S. patent application Ser. No. 17/148,756 filed Jan. 14, 2021, now U.S. Pat. No. 11,444,258 issued Sep. 13, 2022, the disclosure of which is incorporated herein by reference in its entirety. U.S. patent application Ser. No. 17/148,756 is a continuation application of U.S. patent application Ser. No. 16/507,954 filed Jul. 10, 2019, now U.S. Pat. No. 10,916,722 issued Feb. 9, 2021, the disclosure of which is incorporated herein by reference in its entirety. U.S. patent application Ser. No. 16/507,954 claims priority to and benefits of Korean Patent Application 10-2018-0110906 under 35 U.S.C. § 119, filed Sep. 17, 2018, in the Korean Intellectual Property Office, the entire contents of which are incorporated herein by reference for all purposes.

BACKGROUND

1. Field

Embodiments relate to a display device.

2. Description of the Related Art

The importance of a display device has increased with the development of multimedia. Various types of display devices have been developed. Among these, an organic light emitting display device includes an organic light emitting element, i.e., a self-luminous element. The organic light emitting element includes two electrodes facing each other and an organic light emitting layer interposed therebetween. Electrons and holes provided from the two electrodes are recombined in the organic light emitting layer to generate excitons, and the generated excitons are shifted from the excited state to the ground state to emit light.

The organic light emitting display device does not need an additional light source, resulting in low power consuming, thin, and lightweight display device having high-quality characteristics, e.g., a wide viewing angle, high luminance, contrast, etc., and rapid response time. Therefore, the organic light emitting display device has attracted a considerable attention as a next-generation display device.

Realizing full color display in organic light emitting display device may include using organic light emitting elements outputting different colors or using an organic light emitting element outputting a single color and providing a color conversion pattern to obtain additional colors.

SUMMARY

An embodiment of a display device includes a first base portion in which a first light emitting region and a second light emitting region are defined; a first pixel electrode disposed on the first base portion and disposed in the first light emitting region; a second pixel electrode disposed on the first base portion and disposed in the second light emitting region; a first organic layer disposed in the first light emitting region, the first organic layer including a first light emitting layer disposed on the first pixel electrode, a second light emitting layer disposed on the first light emitting layer, and a first charge generating layer disposed between the first light emitting layer and the second light emitting layer; a second organic layer disposed in the second light emitting region the second organic layer including a third light emitting layer disposed on the second pixel electrode; a common electrode disposed on the first organic layer and the second organic layer; a first wavelength conversion pattern disposed on the common electrode, overlapping the first organic layer, and wavelength-converting light of a first color into light of a second color different from the first color; and a light transmitting pattern disposed on the common electrode and overlapping the second organic layer, wherein the third light emitting layer emits the light of the first color, any one of the first light emitting layer and the second light emitting layer emits the light of the first color, the other one of the first light emitting layer and the second light emitting layer emits the light of the second color different from the first color, and the first organic layer does not emit light of a third color having a longer peak wavelength than the light of the first color and the light of the second color.

An embodiment of a display device includes a first base portion in which a light emitting region is defined; a pixel electrode disposed on the first base portion and disposed in the light emitting region; an organic layer disposed on the pixel electrode and including a first light emitting layer, a second light emitting layer overlapping the first light emitting layer, a third light emitting layer overlapping the first light emitting layer and the second light emitting layer, a first charge generating layer disposed between the first light emitting layer and the second light emitting layer, and a second charge generating layer disposed between the second light emitting layer and the third light emitting layer; a common electrode disposed on the organic layer; a thin film encapsulation layer disposed on the common electrode; a second base portion disposed on the thin film encapsulation layer; a wavelength conversion pattern disposed on one surface of the second base portion, the one surface facing the thin film encapsulation layer, and wavelength-converting blue light into green light; a blue light blocking filter disposed between the second base portion and the wavelength conversion pattern; and a filler disposed between the wavelength conversion pattern and the thin film encapsulation layer, wherein any one of the first light emitting layer, the second light emitting layer, and the third light emitting layer emits green light, and the other two of the first light emitting layer, the second light emitting layer, and the third light emitting layer emits blue light.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
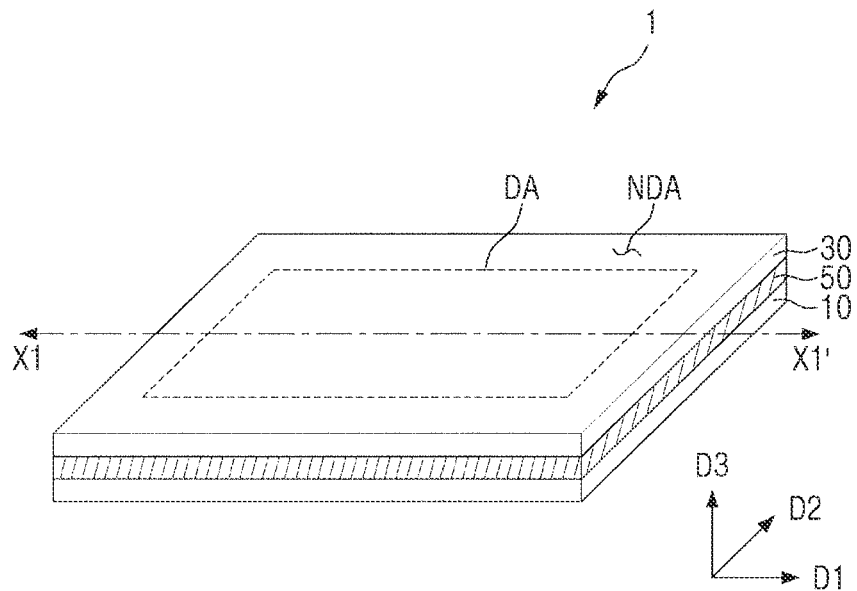
FIG. 1 illustrates a perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

Embodiments to be described herein will be described with reference to plan views and cross-sectional views, which are ideal schematic. Thus, illustrations may be modified by manufacturing techniques and/or tolerances. Accordingly, the embodiments are not limited to specific forms, and also include the variations caused according to the manufacturing process. Therefore, the regions illustrated in the drawings have schematic attributes, and the shapes of the regions illustrated in the drawings are intended to illustrate specific types of regions of the elements.

Hereinafter, embodiments will be described with reference to the attached drawings.

Figure 2:
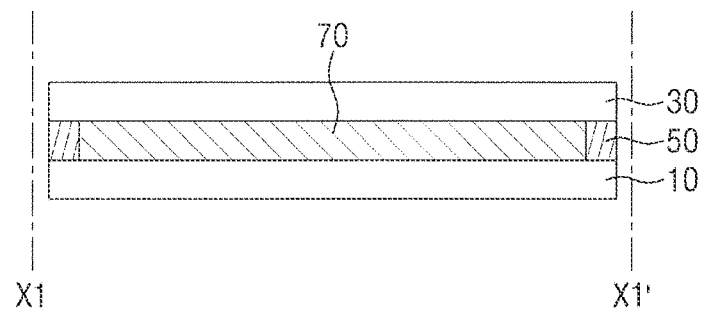
FIG. 2 illustrates a schematic cross-sectional view of the display device taken along the line X1-X1' in FIG. 1.
Figure 3:
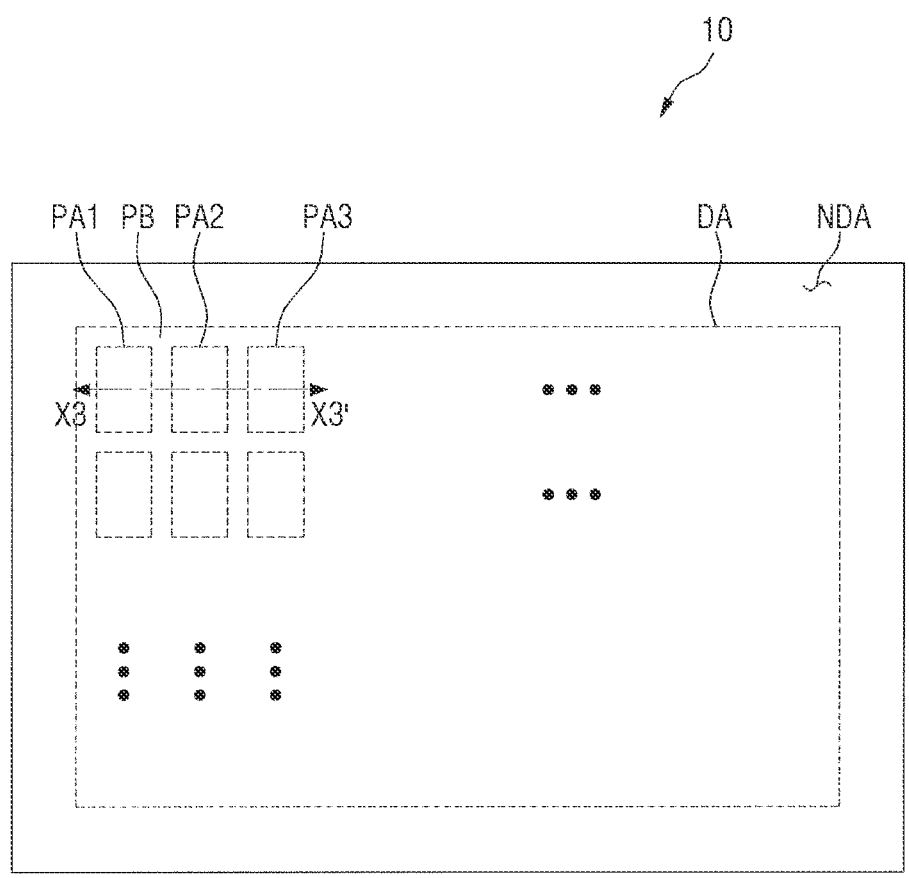
FIG. 3 illustrates a schematic plan view of the display device shown in FIGS. 1 and 2.

FIG. 1 is a perspective view of a display device according to an embodiment. FIG. 2 is a cross-sectional view of the display device taken along the line X1-X1' in FIG. 1. FIG. 3 is a plan view of the display device shown in FIGS. 1 and 2.

Referring to FIGS. 1 to 3, a display device 1 may be applied to various electronic appliances such as tablet PCs, smart phone, car navigation units, cameras, center information displays (CIDs) for cars, wrist watch-type electronic devices, personal digital assistant (PDAs), portable multimedia players (PMPs), game machines, televisions, outside billboards, monitors, personal computers, notebook computers, or the like.

In some embodiments, the display device 1 may have a rectangular shape, a circular shape, a polygonal shape, or the like, in a plan view. The display device 1 may include both short sides extending in a first direction D1 and both long sides extending in a second direction D2 crossing the first direction D1. The corner where the long side and short side of the display device 1 meet each other may be a right angle, an oblique angle, a curved surface, or the like.

The display device 1 may include a display area DA where an image is displayed and a non-display area NDA where an image is not displayed. A plurality of light emitting regions PA1, PA2, and PA3, and a non-light emitting region PB may be defined in the display area DA. In some embodiments, in a plan view, the first light emitting region PA1, the second light emitting region PA2, and the third light emitting region PA3 may form a matrix. The non-light emitting region PB may be defined between the light emitting regions adjacent to each other. In some embodiments, the plurality of light emitting regions PA1, PA2, and PA3, and the non-light emitting region PB may be defined by a pixel defining film of a first substrate 10 to be described later.

In some embodiments, a first light emitting region PA1 emits a first color, e.g., red light having a peak wavelength in a range of about 610 nm to about 650 nm, a second light emitting region PA1 emits a second color, different from the first color, e.g., green light having a peak wavelength in a range of about 510 nm to about 550 nm, and a third light emitting region PA3 emits a third color, different from the first color and the second color, e.g., blue light having a peak wavelength in a range of about 430 nm to about 470 nm. Alternatively, the first light emitting region PA1 may emit green light and the second light emitting region PA2 may emit red light. Hereinafter, for convenience of explanation, light emitted by the first light emitting region PA1 is referred to as a first outgoing light, light emitted by the second light emitting region PA2 is referred to as a second outgoing light, and light emitted by the third light emitting region PA3 is referred to as a third outgoing light. Further, there is exemplarily described a case where the first color is red, the second color is green, and the third color is blue.

A laminate structure, e.g., in which layers are stacked along a third direction D3, crossing the first direction D1 and the second direction D2, of the display device 1 will be described. In some embodiments, the display device includes a first substrate 10 and a second substrate 30 facing the first substrate 10 along the third direction D3, and may further include a sealing portion coupling the first substrate 10 and the second substrate 30, and a filler 70 between the first substrate 10 and the second substrate 30.

The first substrate may include elements and circuits for display an image, for example, pixel circuits such as switching elements, a pixel defining film defining the light emitting regions PA1, PA2, and PA3, and the non-light emitting region PB in the display area DA, and organic light emitting elements. That is, in some embodiments, the first substrate 10 may be a display substrate.

The second substrate 30 may be over the first substrate 10, e.g., overlap the first substrate 10 along the third direction D3, and face the first substrate 10. In some embodiments, the second substrate 30 may include a color conversion pattern for converting the color of incident light. That is, in some embodiments, the second substrate 30 may be a color conversion substrate.

In the non-display area NDA, the sealing portion 50 may be between the first substrate 10 and the second substrate 30. The sealing portion 50 may be along the edges, e.g., a periphery, of the first substrate 10 and the second substrate 30 in the non-display area NDA to surround the display area DA on a plane. The first substrate 10 and the second substrate 30 may be coupled to each other via the sealing portion 50.

In some embodiments, the sealing portion 50 may be made of an organic material, e.g., an epoxy resin or the like. A space between the first substrate 10 and the second substrate 30, and surrounded by the sealing portion 50, may be filled with a filler 70. The filler 70 may fill the space between the first substrate 10 and the second substrate 30. In some embodiments, the filler 70 may be a light-transmitting material. In some embodiments, the filler 70 may be an organic material, e.g., a Si-based organic material, an epoxy-based organic material, or the like.

Figure 4:
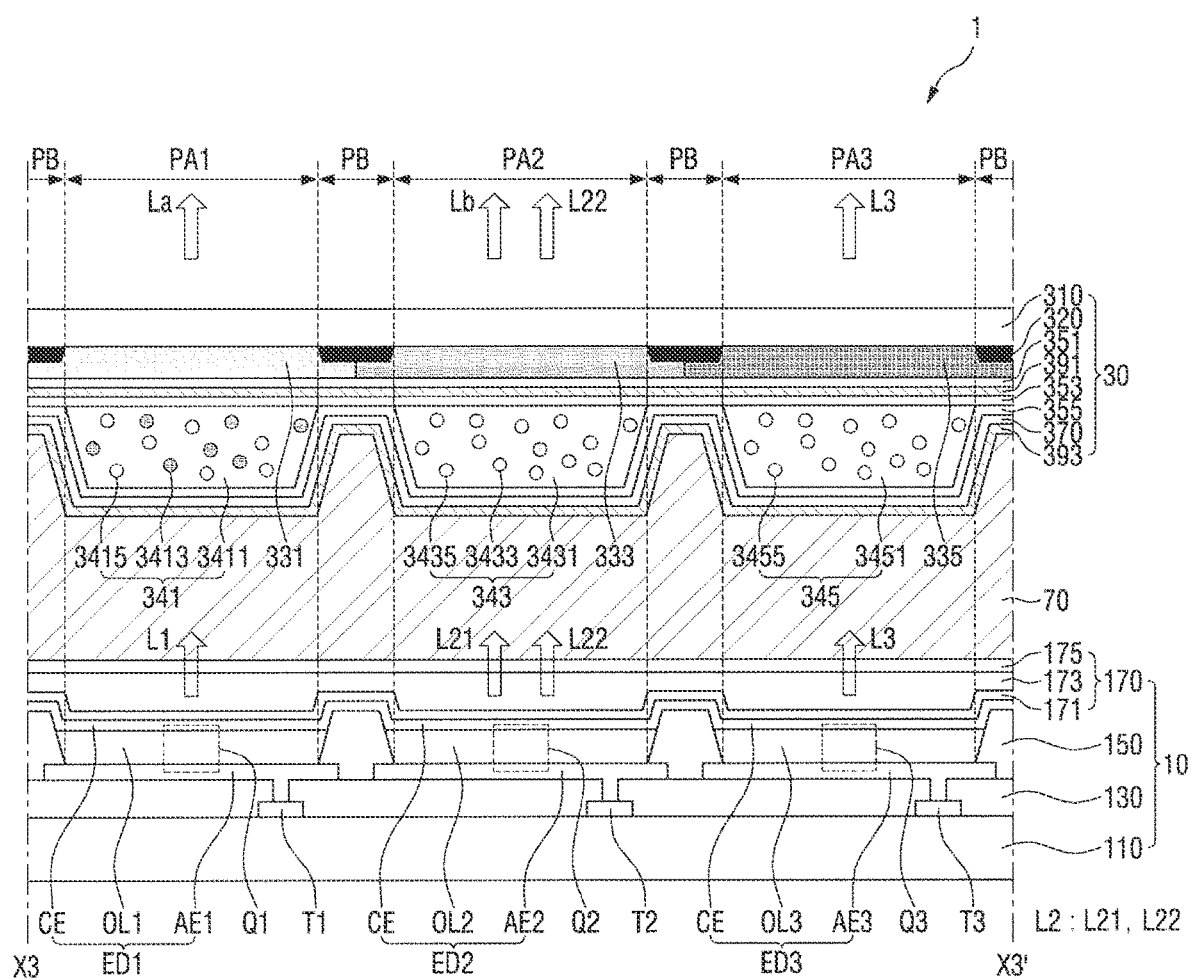
FIG. 4 illustrates a cross-sectional view of the display device taken along the line X3-X3' in FIG. 3.
Figure 5:
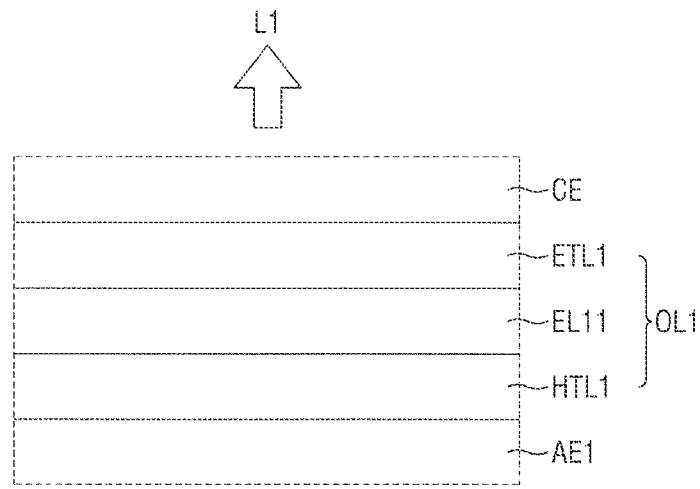
FIG. 5 illustrates an enlarged cross-sectional view of the portion Q1 in FIG. 4.
Figure 6:
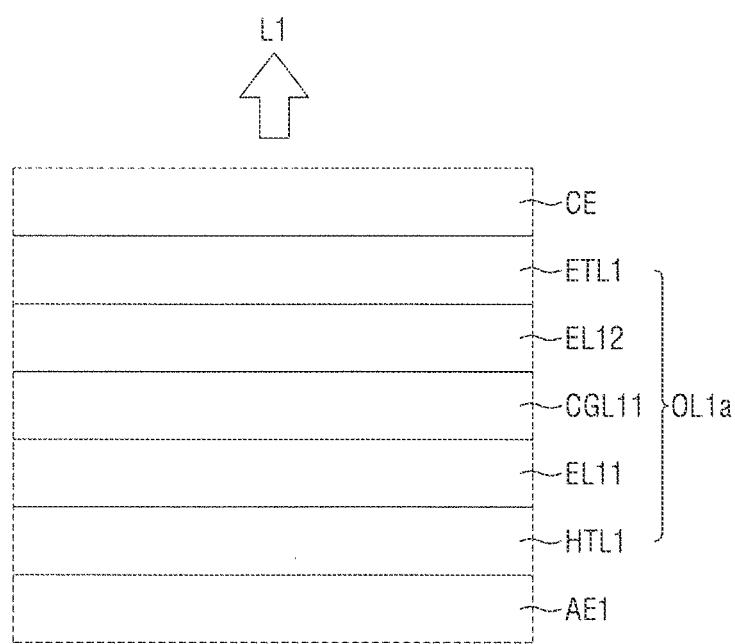
FIG. 6 illustrates a cross-sectional view showing a modification example of the structure shown in FIG. 5.
Figure 7:
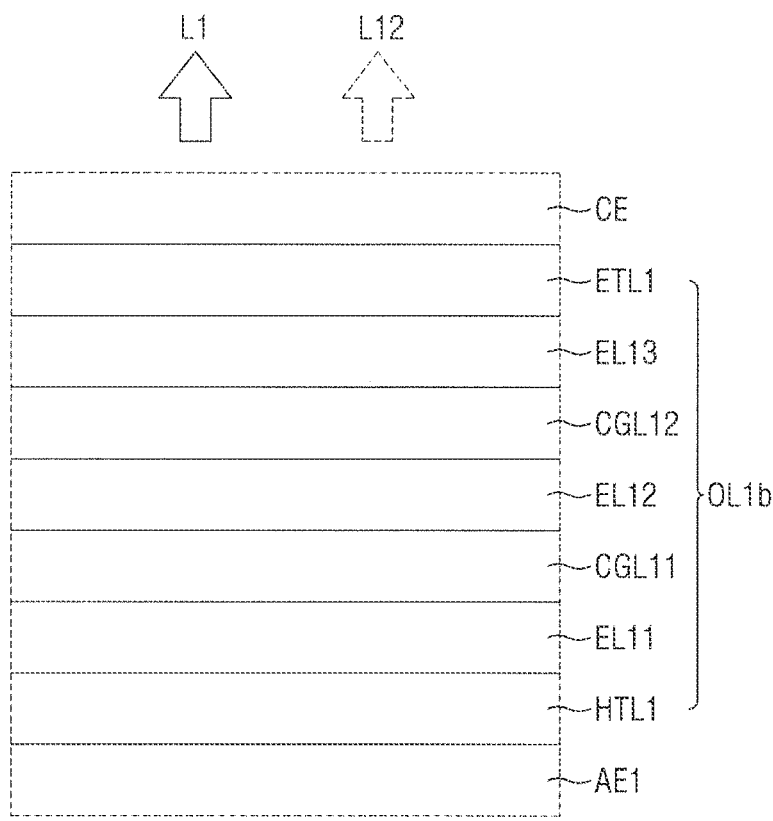
FIG. 7 illustrates a cross-sectional view showing another modification example of the structure shown in FIG. 5.
Figure 8:
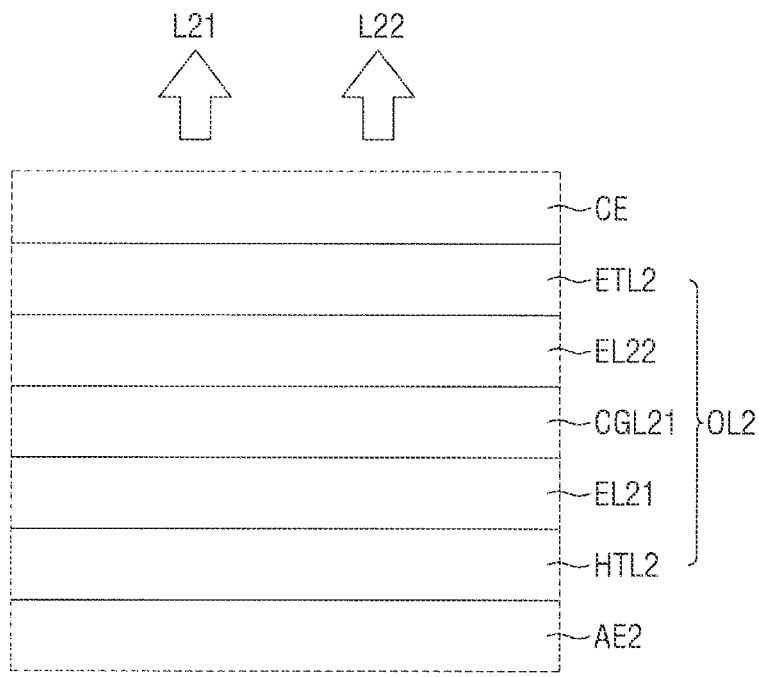
FIG. 8 illustrates an enlarged cross-sectional view of the portion Q2 in FIG. 4.
Figure 9:
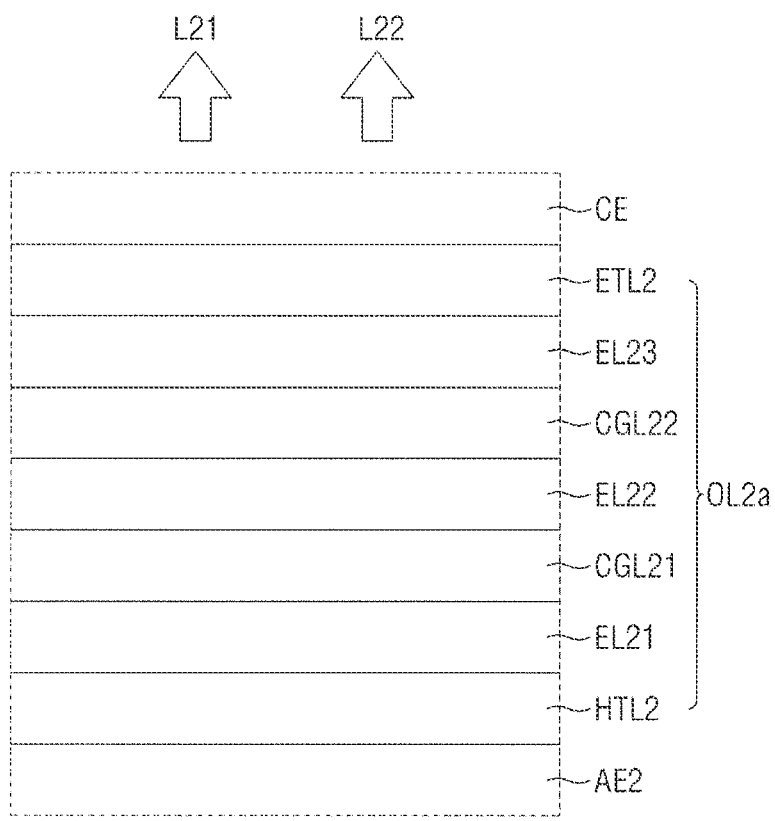
FIG. 9 illustrates a cross-sectional view showing a modification example of the structure shown in FIG. 8.
Figure 10:
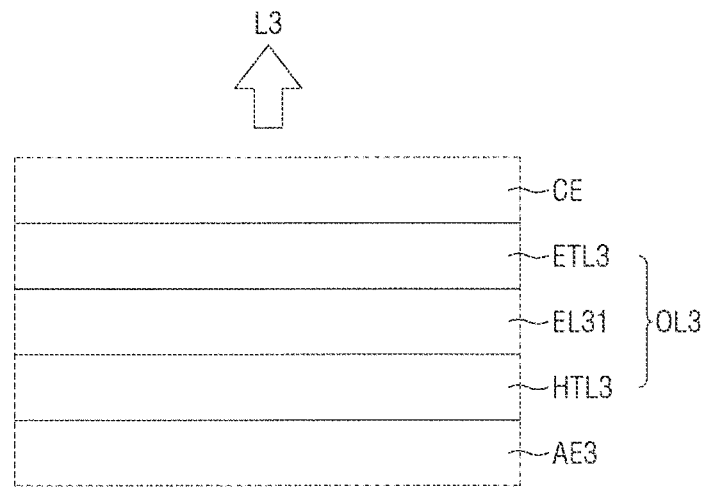
FIG. 10 illustrates an enlarged cross-sectional view of the portion Q3 in FIG. 4.
Figure 11:
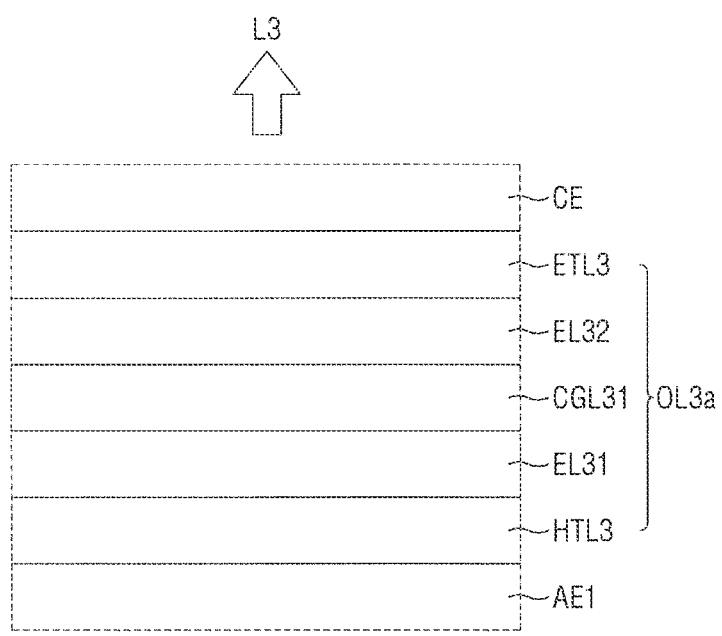
FIG. 11 illustrates a cross-sectional view showing a modification example of the structure shown in FIG. 10.
Figure 12:
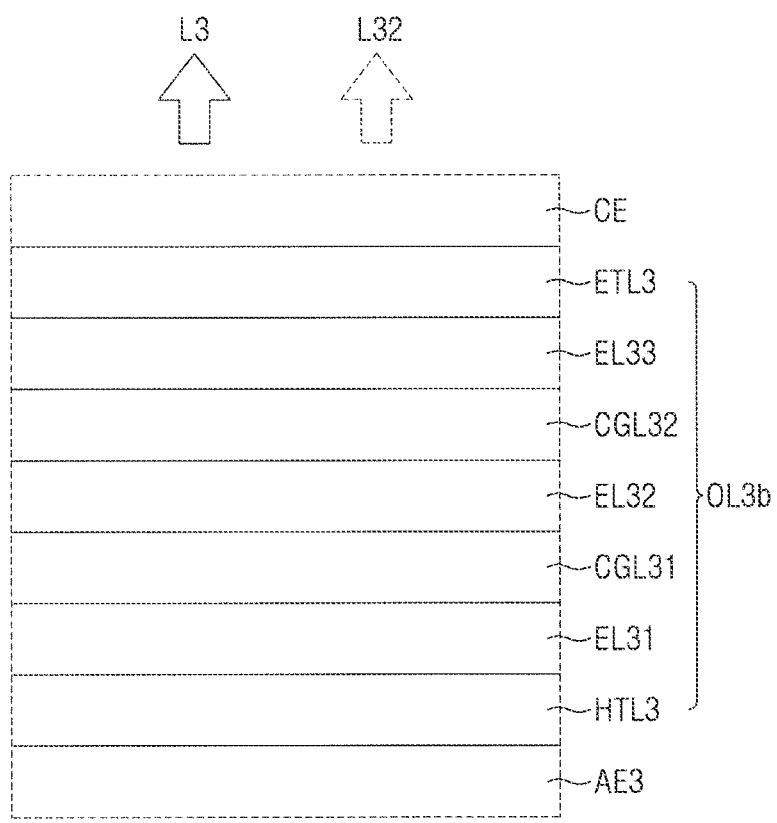
FIG. 12 illustrates a cross-sectional view showing another modification example of the structure shown in FIG. 10.

The structure of the display apparatus 1 will be described in more detail with reference to FIGS. 4 to 12. FIG. 4 is a cross-sectional view of the display device taken along the line X3-X3' in FIG. 3. FIG. 5 is an enlarged cross-sectional view of the portion Q1 in FIG. 4. FIG. 6 is a cross-sectional view showing a modification example of the structure shown in FIG. 5. FIG. 7 is a cross-sectional view showing another modification example of the structure shown in FIG. 5. FIG. 8 is an enlarged cross-sectional view of the portion Q2 in FIG. 4. FIG. 9 is a cross-sectional view showing a modification example of the structure shown in FIG. 8. FIG. 10 is an enlarged cross-sectional view of the portion Q3 in FIG. 4. FIG. 11 is a cross-sectional view showing a modification example of the structure shown in FIG. 10. FIG. 12 is a cross-sectional view showing another modification example of the structure shown in FIG. 10.

Referring to FIGS. 4 to 12, as described above, the display device 1 includes the first substrate 10 and the second substrate 30, and may further include the filler 70 interposed between the first substrate 10 and the second substrate 30.

Hereinafter, the first substrate 10 will be described in more detail.

A first base portion 110 may be made of a material having permeability. In some embodiments, the first base portion 110 may be a glass substrate or a plastic substrate.

In some embodiments, the first base portion 110 may be defined with the first light emitting region PA1, the second light emitting region PA2, the third light emitting region PA3, and the non-light emitting region PB.

Switching elements T1, T2, and T3 may be on the first base portion 110. In some embodiments, the first switching element T1 may be in the first light emitting region PA1, the second switching element T2 may be in the second light emitting region PA2, and the third switching element T3 may be in the third light emitting region PA3. In another embodiment, at least one of the first switching element T1, the second switching element T2, and the third switching element T3 may be in the non-light emitting region PB. A plurality of signal lines, e.g., a gate line, a data line, and a power supply line, transmitting signals to the respective switching elements may be further on the first base portion 110.

An insulating film 130 may be on the first switching element T1, the second switching element T2, and the third switching element T3. In some embodiments, the insulating film 130 may be a planarizing film. In some embodiments, the insulating film 130 may be an organic film, e.g., acrylic resin, an epoxy resin, an imide resin, an ester resin, or the like. In some embodiments, the insulating film 130 may include a positive photosensitive material or a negative photosensitive material.

A first pixel electrode AE1, a second pixel electrode AE2, and a third pixel electrode AE3 may be on the insulating film 130. The first pixel electrode AE1 may be located in the first light emitting region PA1 and at least a part thereof may extend to the non-light emitting region PB, e.g., at both sides thereof. The second pixel electrode AE2 may be located in the second light emitting region PA2 and at least a part thereof may extend to the non-light emitting region PB, e.g., at both sides thereof. The third pixel electrode AE3 may be located in the third light emitting region PA3 and at least a part thereof may extend to the non-light emitting region PB, e.g., at both sides thereof. The first pixel electrode AE1, the second pixel electrode AE2, and the third pixel electrode AE3 may each extend downwards through the insulating film 130 along the third direction D3 to be connected to the first switching element T1, the second switching element T2, and the third switching element T3, respectively.

In some embodiments, each of the first pixel electrode AE1, the second pixel electrode AE2, and the third pixel electrode AE3 may be an anode electrode. The first pixel electrode AE1, the second pixel electrode AE2, and the third pixel electrode AE3 may be reflective electrodes. In this case, each of the first pixel electrode AE1, the second pixel electrode AE2, and the third pixel electrode AE3 may be metal layer including a metal, e.g., Ag, Mg, Al, Pt, Pd, Au, Ni, Nd, Jr, Cr, or the like. In another embodiment, each of the first pixel electrode AE1, the second pixel electrode AE2, and the third pixel electrode AE3 may further include a metal oxide layer laminated on the metal layer. In an exemplary embodiment, each of the first pixel electrode AE1, the second pixel electrode AE2, and the third pixel electrode AE3 may have a two-layer structure of ITO/Ag, Ag/ITO, ITO/Mg, ITO/MgF, or the like, or a multi-layer structure of ITO/Ag/ITO or the like.

A pixel defining film 150 may be on the first pixel electrode AE1, the second pixel electrode AE2, and the third pixel electrode AE3. The pixel defining film 150 may include an opening exposing the first pixel electrode AE1, an opening exposing the second pixel electrode AE2, and an opening exposing the third pixel electrode AE3. The pixel defining film 150 may define the first light emitting region PA1, the second light emitting region PA2, the third light emitting region PA3, and the non-light emitting region PB. In particular, an exposed region of the first pixel electrode AE1, which is not covered by the pixel defining film 150, may be the first light emitting region PA1. Similarly, an exposed region of the second pixel electrode AE2, which is not covered by the pixel defining film 150, may be the second light emitting region PA2, and an exposed region of the third pixel electrode AE3, which is not covered by the pixel defining film 150, may be the third light emitting region PA3. A region where the pixel defining film 150 is provided may be the non-light emitting region PB. In some embodiments, the pixel defining film 150 may include an organic insulating material, e.g., polyacrylate resin, epoxy resin, phenolic resin, polyimide resin, polyimide resin, unsaturated polyester resin, polyphenylene resin, polyphenylenesulfide resin, benzocyclobutene (BCB), or the like.

In the first light emitting region PA1, a first organic layer OL1 may be on the first pixel electrode AE1. Further, in the second light emitting region PA2, a second organic layer OL2 may be on the second pixel electrode AE2. Further, in the third light emitting region PA3, a third organic layer OL3 may be on the third pixel electrode AE3. The first organic layer OL1, the second organic layer OL2, and the third organic layer OL3 may be in the openings of the pixel defining film 150 defining the first light emitting region PA1, the second light emitting region PA2 and the third light emitting region PA3, respectively. Details of the first organic layer OL1, the second organic layer OL2, and the third organic layer OL3 will be described later.

A common electrode CE may be on the first organic layer OL1, the second organic layer OL2, and the third organic layer OL3, e.g., may extend continuously thereon. In some embodiments, the common electrode CE may be a cathode electrode.

In some embodiments, the common electrode CE may have semipermeability or permeability. When the common electrode CE has semi-permeability, the common electrode CE may include Ag, Mg, Cu, Al, Pt, Pd, Au, Ni, Nd, Jr, Cr, Li, Ca, LiF/Ca, LiF/Al, Mo, Ti, or the like, or a compound or mixture thereof, e.g., a mixture of Ag and Mg. Further, when the thickness of the common electrode CE is several tens to several hundreds of angstroms, the common electrode CE may have semipermeability. When the common electrode CE has permeability, the common electrode CE may include a transparent conductive oxide (TCO), e.g., tungsten oxide ($W_xO_x$), titanium oxide ($TiO_2$), indium tin oxide (ITO), indium zinc oxide (IZO), zinc oxide (ZnO), indium tin zinc oxide (ITZO), magnesium oxide (MgO), or the like.

The first pixel electrode AE1, the first organic layer OL1, and the common electrode CE may constitute a first organic light emitting element ED1, the second pixel electrode AE2, the second organic layer OL2, and the common electrode CE may constitute a second organic light emitting element ED2, and the third pixel electrode AE3, the third organic layer OL3, and the common electrode CE may constitute a third organic light emitting element ED3. The first organic light emitting element ED1 may emit first light L1, the second organic light emitting element ED2 may emit second light L2, e.g., and the third organic light emitting element ED3 may emit third light L3.

As described above, the first organic layer OL1 may be between the first pixel electrode AE1 and the common electrode CE. As shown in FIG. 5, the first organic layer OL1 may include a first hole transporting layer HTL1 on the first pixel electrode AE1, a first light emitting layer EL11 on the first hole transporting layer HTL1, and a first electron transporting layer ETL1 on the first light emitting layer EL11.

The first hole transporting layer HTL1 includes a hole transporting material. Examples of the hole transporting material may include carbazole-based derivatives such as N-phenylcarbazole and polyvinylcarbazole; fluorene-based derivatives; triphenylamine-based derivatives such as TPD (N,N-bis(3-methylphenyl)-N,N-diphenyl-[1,1-biphenyl]-4, 4'-diamine) and TCTA (4,4',4"-tris(N-carbazolyl)triphenylamine); and NPB (N,N-di(1-naphthyl)-N,N-diphenylbenzidine) and TAPC (4,4'-Cyclohexylidene bis[N,N-bis(4-methylphenyl)benzenamine]).

In some embodiment, a hole injection layer may be between the first pixel electrode AE1 and the first hole transporting layer HTL1. The hole injection layer may include a phthalocyanine compound, e.g., copper phthalocyanine; and a hole injection material, e.g. DNTPD (N,N'-diphenyl-N,N'-bis-[4-(phenyl-m-tolyl-amino)-phenyl]-biphenyl-4,4'-diamine), m-MTDATA (4,4',4"-tris(3-methylphenylphenylamino)triphenylamine), TDATA (4,4'4"-Tris(N,N-diphenylamino)triphenylamine), 2-TNATA (4,4',4"-tris {N,-(2-naphthyl)-N-phenylamino}-triphenylamine), PEDOT/PSS (Poly(3,4-ethylenedioxythiophene)/Poly(4-styrenesulfonate), ANI/DBSA (Polyaniline/Dodecylbenzenesulfonic acid), PANI/CSA (Polyaniline/Camphor sulfonic acid), or PANI/PSS ((Polyaniline)/Poly (4-styrenesulfonate).

In an embodiment, the hole injecting layer may further include a charge generating material for improving conductivity. The charge generating material may be, for example, a p-type dopant, and the p-type dopant may be one of a quinone derivative, a metal oxide, and a compound containing a cyano group. In another embodiment, the p-type dopant may include quinone derivatives such as TCNQ (tetracyanoquinodimethane) and F4-TCNQ (2,3,5,6-tetrafluoro-tetracyanoquinodimethane), and metal oxides such as tungsten oxides and molybdenum oxides.

The first light emitting layer EL11 may be on the first hole transporting layer HTL1. The first light emitting layer EL11 may emit light of the third color, e.g., blue light. In some embodiments, the blue light emitted by the first light emitting layer EL11 may have a peak wavelength in a range of 430 nm to 470 nm. That is, in some embodiments, the first light emitting layer EL11 may be a blue light emitting layer. In some embodiments, the first light emitting layer EL11 may include a host and a dopant. The host may be any commonly used material, e.g., Alq3 (tris(8-hydroxyquinolino)aluminum), CBP (4,4'-bis(N-carbazolyl)-1,1'-biphenyl), PVK (poly(n-vinylcabazole)), AND (9,10-di(naphthalene-2-yl)anthracene), TCTA (4,4',4"-Tris(carbazol-9-yl)-triphenylamine), TPBi (1,3,5-tris(N-phenylbenzimidazole-2-yl)benzene), TBADN (3-tert-butyl-9,10-di(naphth-2-yl) anthracene), DSA (distyrylarylene), CDBP (4,4'-bis(9-carbazolyl)-2,2"-dimethyl-biphenyl), and MADN (2-Methyl-9,10-bis(naphthalen-2-yl)anthracene).

The first light emitting layer EL11 emitting blue light may include a fluorescent material, e.g., spiro-DPVBi-based, spiro-6P-based, DSB (distyryl-benzene)-based, DSA (distyryl-arylene)-based, and PFO (polyfluorene)-based polymers, and PPV (poly(p-phenylene vinylene)-based polymers. As another example, the first light emitting layer EL11 may include a phosphor material including an organometallic complex, e.g., (4,6-F2ppy)2Irpic.

The first electron transporting layer ETL1 may be on the first light emitting layer EL11. In some embodiments, the first electron transporting layer ETL1 may include an electron transporting material, e.g., s Alq3(tris(8-hydroxyquinolinato)aluminum), TPBi (1,3,5-tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tert-butylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato)aluminum), Bebq2 (berylliumbis(benzoquinolin-10-olate), ADN (9,10-di(naphthalene-2-yl)anthracene), or a mixture thereof.

In some embodiments, an electron injection layer may be further between the first electron transporting layer ETL1 and the common electrode CE. The electron injection layer may include an electron injecting material, e.g., a lanthanum group metal such as LiF, LiQ, Li2O, BaO, NaCl, CsF, or Yb, or a halogenated metal, e.g., RbCl or RbI. For example, in another embodiment, the electron injection layer may include a mixture of an electron transporting material and an insulating organometallic salt, and the organometallic salt may be a material having an energy band gap of about 4 eV or more. The organometallic salt may include metal acetate, metal benzoate, metal acetoacetate, metal acetylacetonate, or metal stearate.

The first organic layer OL1 having the above structure may include only one light emitting layer, e.g., the first light emitting layer EL11. The first light emitting layer EL11 may be a blue light emitting layer. Therefore, the first light L1 emitted by the first organic layer OL1 may be blue light.

However, the laminate structure of the first organic layer OL1 is not limited thereto. The laminate structure of the first organic layer OL1 may be modified as shown in FIGS. 6 and 7.

For example, as shown in FIG. 6, a first organic layer OL1a may further include a first charge generating layer CGL11 on the first light emitting layer EL11 and a second light emitting layer EL12 on the first charge generating layer CGL11. The first charge transporting layer ETL1 may be on the second light emitting layer EL12.

The first charge generating layer CGL11 may serve to inject a charge into each light emitting layer. The first charge generating layer CGL11 may control a charge balance between the first light emitting layer EL11 and the second light emitting layer EL12. In some embodiments, the first charge generating layer CGL11 may include an n-type charge generating layer and a p-type charge generating layer. The p-type charge generating layer may be on the n-type charge generating layer.

The first charge generating layer CGL11 may have a structure in which the n-type charge generating layer and the p-type charge generating layer are attached to each other. The n-type charge generating layer may be closer to the first pixel electrode AE1 of the first pixel electrode AE1 than to the common electrode CE. The p-type charge generating layer may be closer to the common electrode CE that to the first pixel electrode AE1. The n-type charge generating layer may supply electrons to the first light emitting layer EL11 adjacent to the first pixel electrode AE1 and the p-type charge generating layer may supply holes to the second light emitting layer EL12. The first charge generating layer CGL11 may be between the first light emitting layer EL11 and the second light emitting layer EL12 to provide a charge to the respective light emitting layers, thereby increasing a light emitting efficiency and decreasing a driving voltage.

Similarly to the first light emitting layer EL11, the second light emitting layer EL12 may emit blue light. In some embodiments, the blue light emitted by the second light emitting layer EL12 may have the same peak wavelength range as the blue light emitted by the first light emitting layer EL11. In some embodiments, the second light emitting layer EL12 may be made of the same material as the first light emitting layer EL11, or may include at least one selected from the aforementioned materials included in the first light emitting layer EL11. In some other embodiments, the first light emitting layer EL11 and the second light emitting layer EL12 may be made of different materials from each other, and the blue light emitted by the second light emitting layer EL12 may have a different peak wavelength range from the blue light emitted by the first light emitting layer EL11.

The first organic layer OL1a having the above-described structure may include two light emitting layers, e.g., the first light emitting layer EL11 and the second light emitting layer EL12 as light emitting layers. The first light emitting layer EL11 and the second light emitting layer EL12 may be blue light emitting layers. Accordingly, the first light L1 emitted by the first organic layer OL1a may be blue light, and the light emitting efficiency and lifetime of the first organic layer OL1a may be improved as compared with those of the first organic layer OL1 including only one light emitting layer.

Alternatively, as shown in FIG. 7, a first organic layer OL1b may further include a first charge generating layer CGL11 on the first light emitting layer EL11, a second light emitting layer EL12 on the first charge generating layer CGL11, a second charge generating layer CGL12 on the second light emitting layer EL12, and a third light emitting layer EL13 on the second charge generating layer CGL12. The first charge transporting layer ETL1 may be on the third light emitting layer EL13. In some embodiments, the second light emitting layer EL12 may be a blue light emitting layer as described above with reference to FIG. 6.

The second charge generating layer CGL12 may have substantially the same structure as the aforementioned first charge generating layer CGL11. For example, the second charge generating layer CGL12 may include an n-type charge generating layer closer to the first pixel electrode AE1 than to the common electrode CE, and a p-type charge generating layer closer to the common electrode CE than to the first electrode AE1. In some embodiments, the second charge generating layer CGL12 may have a structure in which the n-type charge generating layer and the p-type charge generating layer are attached to each other. The first charge generating layer CGL11 and the second charge generating layer CGL12 may be made of different materials, or may be made of the same material. The second charge generating layer CGL12 may supply electrons to the second light emitting layer EL12 and may supply holes to the third light emitting layer EL13.

The third light emitting layer EL13 may emit light of a color different from that of the light emitted by the first light emitting layer EL11 and the second light emitting layer EL12. In some embodiments, the third light emitting layer EL13 may emit light of the second color, e.g., green light, as indicated by the two sub-lights L11 (blue) and L12 (green). In some embodiments, the green light emitted by the third light emitting layer EL13 may have a peak wavelength in a range of 510 nm to 550 nm. That is, in some embodiments, the third light emitting layer EL13 may be a green light emitting layer. In some embodiments, the third light emitting layer EL13 may include a host and a dopant. The host included in the third light emitting layer EL13 may be any one of the examples of the host exemplified in the description of the first light emitting layer EL11. Example of the host included in the third light emitting layer EL13 may include a fluorescent material, e.g., Alq3(tris-(8-hydroyquinolato) aluminum(III)), and a phosphor material, e.g., Ir(ppy)3(fac tris(2-phenylpyridine)iridium), Ir(ppy)2(acac) (Bis(2-phenylpyridine)(acetylacetonate)iridium(III)), and Ir(mpyp)3(2-phenyl-4-methyl-pyridine iridium).

However, the laminating order of the first light emitting layer EL11 for emitting blue light, the second light emitting layer EL12 for emitting blue light, and the third light emitting layer EL13 for emitting green light may be variously changed. Illustratively, the third light emitting layer EL13 may be between the first hole transporting layer HTL1 and the first charge generating layer CGL11, the first light emitting layer EL11 may be between the first charge generating layer CGL11 and the second charge generating layer CGL12, and the second light emitting layer EL12 may be between the second charge generating layer CGL12 and the first electron transporting layer ETL1. Alternatively, the first light emitting layer EL11 may be between the first hole transporting layer HTL1 and the first charge generating layer CGL11, the third light emitting layer EL13 may be between the first charge generating layer CGL11 and the second charge generating layer CGL12, and the second light emitting layer EL12 may be between the second charge generating layer CGL12 and the first electron transporting layer ETL1.

The first organic layer OL1b having the aforementioned structure may include three light emitting layers, e.g., the first light emitting layer EL11, the second light emitting layer EL12, and the third light emitting layer EL13 as light emitting layers. Further, the first light emitting layer EL11 and the second light emitting layer EL12 may be blue light emitting layers, and the third light emitting layer EL13 may be a green light emitting layer. Accordingly, the first organic layer OL1b may emit blue light as the first sub-light L1 and green light as the sub-light L12.

However, the third light emitting layer EL13, similarly to the first light emitting layer EL11 and the second light emitting layer EL12, may emit blue light. That is, the third light emitting layer EL13 may be a blue light emitting layer. In this case, the first organic layer OL1b may not emit the sub-light L12 which is green light, and may emit only blue light as the first light L1.

In some embodiments, the first organic layer OL1 shown in FIG. 5, the first organic layer OL1a shown in FIG. 6, and the first organic layer OL1b shown in FIG. 7 may not include red light emitting layers, and thus may not emit red light.

As shown in FIG. 8, the second organic layer OL2 may include a second hole transport layer HTL2 on the second pixel electrode AE2, a fourth light emitting layer EL21 on the second hole transporting layer HTL2, a third charge generating layer CGL21 on the fourth light emitting layer EL21, and a second electron transport layer ETL2 on the third charge generating layer CGL21. The common electrode CE may be on the second electron transporting layer ETL2.

The second hole transporting layer HTL2 may have substantially the same structure and the same material as the aforementioned first hole transporting layer HTL1. In some embodiments, the second hole transporting layer HTL2 may be separated from the first hole transporting layer HTL1 without being connected thereto. In other embodiments, the second hole transporting layer HTL2 and the first hole transporting layer HTL1 may be connected to each other or may be integrated with each other.

The fourth light emitting layer EL21 may be on the second hole transporting layer HTL2. The fourth light emitting layer EL21, similarly to the first light emitting layer EL11, may emit light of the third color, e.g., blue light. The blue light emitted by the fourth light emitting layer EL21 may have the same peak wavelength range as the blue light emitted by the first light emitting layer EL11. In some embodiments, the fourth light emitting layer EL21 may be made of the same material as the first light emitting layer EL11, or may include at least one selected from the aforementioned materials included in the first light emitting layer EL11.

The third charge generating layer CGL21 may have substantially the same structure as the aforementioned first charge generating layer CGL11. The third charge generation layer CGL21 may supply electrons to the fourth light emitting layer EL21, and may supply holes to the fifth light emitting layer EL22.

The fifth light emitting layer EL22 may emit light of the second color, e.g., green light. In some embodiments, the peak wavelength range of the green light emitted by the fifth light emitting layer EL22 may be 510 nm to 550 nm. In some embodiments, the fifth light emitting layer EL22 may include the materials exemplified in the description in the case where the third light emitting layer EL13 is a green light emitting layer. In some embodiments, when the third light emitting layer EL13 of the first organic layer OL1b is a green light emitting layer, the fifth light emitting layer EL22 may be made of the same material as the third light emitting layer EL13.

The second electron transporting layer ETL2 may have substantially the same structure and the same material as the aforementioned first electron transporting layer ETL1. In some embodiments, as shown in the drawing, the second electron transporting layer ETL2 may be separated from the first electron transporting layer ETL1 without being connected thereto. In other embodiments, the second electron transporting layer ETL2 and the first electron transporting layer ETL1 may be connected to each other or may be integrated with each other.

The laminating order of the fourth light emitting layer EL21 for emitting blue light and the fifth light emitting layer EL22 for emitting green light maybe variously altered. For example, the fifth light emitting layer EL22 may be between the second hole transporting layer HTL2 and the third charge generating layer CGL21, and the fourth light emitting layer EL21 may be between the third charge generating layer CGL21 and the second electron transporting layer ETL2.

The second organic layer OL2 having the aforementioned structure may include two light emitting layers, e.g., the fourth light emitting layer EL21 and the fifth light emitting layer EL22. Further, the fourth light emitting layer EL21 may be a blue light emitting layer, and the fifth light emitting layer EL22 may be a green light emitting layer. Accordingly, the second light L2 emitted by the second organic layer OL2 may include a first sub-light L21 which is blue light and a second sub-light L22 which is green light. Since the second organic layer OL2 emits green light as well as blue light, the total amount of green light emitted to the outside of the display device 1 in the second light emitting region PA2 may be increased.

However, the laminate structure of the second organic layer OL2 is not limited thereto, and may be modified as shown in FIG. 9. Referring to FIG. 9, an organic layer OL2a, unlike the second organic layer OL2, may further include a fourth charge generating layer CGL22 on the fifth light emitting layer EL22 and a sixth light emitting layer EL23 on the fourth charge generating layer CGL22. The second electron transporting layer ETL2 may be on the sixth light emitting layer EL23.

In some embodiments, the sixth light emitting layer EL23, similarly to the first light emitting layer EL11, may emit light of the third color, e.g., blue light. That is, the sixth light emitting layer EL23 may be a blue light emitting layer. The sixth light emitting layer EL23 may be made of the same material as the first light emitting layer EL11, or may include at least one selected from the aforementioned materials included in the first light emitting layer EL11.

The laminating order of the fourth light emitting layer EL21 for emitting blue light, the fifth light emitting layer EL22 for emitting green light, and the sixth light emitting layer EL23 for emitting blue light maybe variously altered. For example, the fourth light emitting layer EL21 may be between the second hole transporting layer HTL2 and the third charge generating layer CGL21, the sixth light emitting layer EL23 may be between the third charge generating layer CGL21 and the fourth charge generating layer CGL22, and the fifth light emitting layer EL22 may be between the fourth charge generating layer CGL22 and the second electron transporting layer ETL2. Alternatively, the fifth light emitting layer EL22 may be between the second hole transporting layer HTL2 and the third charge generating layer CGL21, the fourth light emitting layer EL21 may be between the third charge generating layer CGL21 and the fourth charge generating layer CGL22, and the sixth light emitting layer EL23 may be between the fourth charge generating layer CGL22 and the second electron transporting layer ETL2.

Since the second organic layer OL2a having the aforementioned structure further includes a light emitting layer that emits blue light, e.g., the sixth light emitting layer EL23, as compared with the second organic layer OL2 shown in FIG. 8, it is possible to further increase the amount of the first sub-light L21, i.e., blue light, emitted by the second organic layer OL2a.

In some embodiments, the second organic layer OL2 shown in FIG. 8 and the second organic layer OL2a shown in FIG. 9 may not include a red light emitting layer, and thus may not emit red light.

As shown in FIG. 10, an organic layer OL3 may include a third hole transporting layer HTL3 on the third pixel electrode AE3, a seventh light emitting layer EL31 on the third hole transporting layer HTL3, and a third electron transport layer ETL3 on the seventh light emitting layer EL31. In some embodiments, the third organic layer OL3 may have substantially the same structure as the first organic layer OL1.

The third hole transporting layer HTL3 may be made of the same material as the first hole transporting layer HTL1, and may have the same structure as the first hole transporting layer HTL1. The third hole transporting HTL3 is shown as being separated from the first hole transporting layer HTL1 and the second hole transporting layer HTL2. Alternatively, the first hole transporting layer HTL1, the second hole transporting layer HTL2, and the third hole transporting layer HTL3 may be connected to or integrated with each other.

The seventh light emitting layer EL31 may emit light of the same color as the first light emitting layer EL11. For example, the seventh light emitting layer EL31, similarly to the first light emitting layer EL11, may be a blue light emitting layer that emits blue light. The seventh light emitting layer EL31 may be made of the same material as the first light emitting layer EL11 or may include the materials mentioned as examples of the constituent materials of the first light emitting layer EL11.

The third electron transporting layer ETL3 may have substantially the same structure and the same material as the aforementioned first electron transporting layer ETL1. In some embodiments, as shown in the drawing, the third electron transporting layer ETL2 may be separated from the first electron transporting layer ETL1 and the second electron transporting layer ETL2 without being connected thereto. In another embodiment, the first electron transporting layer ETL1, the second electron transporting layer ETL2, and the third electron transporting layer ETL3 may be connected to each other or may be integrated with each other.

The third organic layer OL3 having the aforementioned structure may include only the seventh light emitting layer EL31 as a light emitting layer, and the seventh light emitting layer EL31 may be a blue light emitting layer. Therefore, the third light L3 emitted by the third organic layer OL3 may be blue light.

However, the laminate structure of the third organic layer OL3 may be variously modified as shown in FIGS. 11 and 12.

For example, as shown in FIG. 11, a third organic layer OL3a may further include a fifth charge generating layer CGL31 on the seventh light emitting layer EL31 and an eighth light emitting layer EL32 on the fifth charge generating layer CGL31. The third electron transporting layer ETL1 may be on the eighth light emitting layer EL32.

The fifth charge generating layer CGL31 may have substantially the same structure as the aforementioned first charge generating layer CGL11. The fifth charge generating layer CGL31 may supply electrons to the seventh light emitting layer EL31, and may supply holes to the eighth light emitting layer EL32.

The eighth light emitting layer EL32, similarly to the seventh light emitting layer EL31, may emit blue light. That is, in some embodiments, the eighth light emitting layer EL32 may be a blue light emitting layer. In some embodiments, the eighth light emitting layer EL32 may be made of the same material as the first light emitting layer EL11, or may include materials selected from the aforementioned constituent materials of the first light emitting layer EL11.

The third organic layer OL3a having the above-described structure may include two blue light emitting layers, for example, the seventh light emitting layer EL31 and the eighth light emitting layer EL32 as light emitting layers. Accordingly, the third light L3 emitted by the third organic layer OL3a may be blue light, and the light emitting efficiency and lifetime of the third organic layer OL3a may be improved as compared with those of the third organic layer OL3 including only one light emitting layer.

Alternatively, as shown in FIG. 12, a third organic layer OL3b may further include a sixth charge generating layer CGL32 on the eighth light emitting layer EL32 and a ninth light emitting layer EL33 on the sixth charge generating layer CGL32, as compared with the third organic layer OL3a shown in FIG. 11. The third charge transporting layer ETL3 may be on the ninth light emitting layer EL33.

The sixth charge generating layer CGL32 may have substantially the same structure as the aforementioned first charge generating layer CGL11. The sixth charge generating layer CGL32 may supply electrons to the eighth light emitting layer EL32, and may supply holes to the ninth light emitting layer EL33.

Similarly to the third light emitting layer EL13, in some embodiments, the ninth light emitting layer EL33 may be a green light emitting layer. When the ninth light emitting layer EL33 is a green light emitting layer, the third organic layer OL3b may emit green light as the sub-light L32 as well as the third light L3 which is blue light.

When the ninth light emitting layer EL33 is a green light emitting layer, the position of the ninth light emitting layer EL33 may be variously changed. For example, the ninth light emitting layer EL33 may be between the third hole transporting layer HTL3 and the fifth charge generating layer CGL31, the seventh light emitting layer EL31 may be between the fifth charge generating layer CGL31 and the sixth charge generating layer CGL32, and the eighth light emitting layer EL32 may be between the sixth charge generating layer CGL32 and the third electron transporting layer ETL3. Alternatively, the ninth light emitting layer EL33 may be between the fifth charge generating layer CGL31 and the sixth charge generating layer CGL32, the seventh light emitting layer EL31 may be between the third hole transporting layer HTL3 and the fifth charge generating layer CGL31, and the eighth light emitting layer EL32 may be between the sixth charge generating layer CGL32 and the third electron transporting layer ETL3. However, the ninth light emitting layer EL33 may be a blue light emitting layer.

In some embodiments, the third organic layer OL3 shown in FIG. 10, the third organic layer OL3a shown in FIG. 11, and the third organic layer OL3b shown in FIG. 12 may not include a red emitting layer, and thus may not emit red light.

Referring back to FIG. 4, a thin film encapsulation layer 170 may be on the common electrode CE. The thin film encapsulation layer 170 may be commonly on the first light emitting region PA1, the second light emitting region PA2, the third light emitting region PA3, and the non-light emitting region PB. In some embodiments, the thin film encapsulation layer 170 directly covers the common electrode CE. In some embodiments, a capping layer covering the common electrode CE may be further between the thin film encapsulation layer 170 and the common electrode CE. In this case, the thin film encapsulation layer 170 may directly cover the capping layer.

In some embodiments, the thin film encapsulation layer 170 may include a first encapsulating inorganic film 171, an encapsulating organic film 173, and a second encapsulating inorganic film 175, which are sequentially laminated on the common electrode CE. In some embodiments, each of the first encapsulating inorganic film 171 and the second encapsulating inorganic film 175 may be made of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like. In some embodiments, the encapsulating organic film 173 may be made of acrylic resin, methacrylic resin, polyisoprene, vinyl resin, epoxy resin, urethane resin, cellulose resin, perylene resin, or the like. The laminate structure of the thin encapsulation layer 170 may be variously changed.

Hereinafter, the second substrate 30 will be described. A second base portion 310 may be made of a material having permeability. In some embodiments, the second base portion 310 may be a glass substrate or a plastic substrate.

A light blocking member 320 may be on one surface of the second base portion 310, facing the first substrate 10. The light blocking member 320 may be in the non-light emitting region PB, and may block the transmission of light. For example, the light blocking member 320 may form of a lattice in a plan view, and may prevent color mixture due to light entering between adjacent light emitting regions.

A first color filter 331 may be on one surface of the second base portion 310 in the first light emitting region PA1, a second color filter 333 may be on one surface of the second base portion 310 in the second light emitting region PA2, and a third color filter 335 may be on one surface of the second base portion 310 in the third light emitting region PA3.

The first color filter 331 may block or absorb light of the third color, e.g., blue light. That is, the first color filter 331 may function as a blue light blocking filter for blocking blue light. In some embodiments, the first color filter 331 may selectively transmit light of the first color, e.g., red light, and may block or absorb light of the second color, e.g., green light. Illustratively, the first color filter 331 may be a red color filter, and may include a red colorant.

The second color filter 333 may block or absorb light of the third color, e.g., blue light. That is, the second color filter 333 may function as a blue light blocking filter for blocking blue light. In some embodiments, the second color filter 333 may selectively transmit light of the second color, e.g., green light, and may block or absorb light of the first color, e.g., red light. Illustratively, the second color filter 333 may be a green color filter, and may include a green colorant.

The third color filter 335 may selectively transmit light of the third color, e.g., blue light, and may block or absorb light of the first color, e.g., red light, and light of the second color, e.g., green light. In some embodiments, the third color filter 335 may be a blue color filter and may include a blue colorant.

In some embodiments, a boundary portion between the first color filter 331 and the second color filter 333, and a boundary portion between the second color filter 333 and the third color filter 335 may be in the non-light emitting region PB. A light blocking member 320 may be between the second base portion 310 and the boundary portion of the first color filter 331 and the second color filter 333, and between the second base portion 310 and the boundary portion of the second color filter 333 and the third color filter 335.

A first capping layer 351 may be on the first color filter 331, the second color filter 333, and the third color filter 335. The first capping layer 351 may prevent the damage or contamination of the first color filter 331, the second color filter 333, and the third color filter 335 due to the penetration of impurities such as moisture and air from the outside. Further, the first capping layer 351 may prevent the colorants included in the first color filter 331, the second color filter 333, and the third color filter 335 from diffusing into another component, for example, a first low refractive index layer. In some embodiments, the first capping layer 351 may be made of an inorganic material, e.g., silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like.

In some embodiments, the first low refractive index layer 391 may be on the first capping layer 351. The first low refractive index layer 391 may be over the first light emitting region PA1, the second light emitting region PA2, the third light emitting region PA3, and the non-light emitting region PB. In some embodiments, the first low refractive index layer 391 may have a lower refractive index than a first wavelength conversion pattern 341 and a second wavelength conversion pattern 343. For example, the first low refractive index layer 391 may have a refractive index of about 1.1 to about 1.4. In some embodiments, each of the refractive indexes of the first wavelength conversion pattern 341 and the second wavelength conversion pattern 343 may be larger than the refractive index of the first low refractive index layer 391 by 0.3 or more. Further, in some embodiment, the refractive index of the light transmitting pattern 345 may also be larger than the refractive index of the first low refractive index layer 391 by 0.3 or more.

In some embodiments, the first low refractive index layer 391 may reflect a part of the light emitted in a direction from the first wavelength conversion pattern 341 and the second wavelength conversion pattern 343 to the second base portion 310 toward the first wavelength conversion pattern 341 and the second wavelength conversion pattern 343 again. That is, since the first low refractive index layer 391 recycles at least a part of the light transmitted through the first wavelength conversion pattern 341 and the second wavelength conversion pattern 343 toward the second base portion 310, light utilization efficiency can be improved, and as a result, the light efficiency of the display device 1 can be improved.

In some embodiments, the first low refractive index layer 391 may include a base resin and particles dispersed in the base resin. In some embodiments, the particles included in the first low refractive index layer 391 may be, e.g., at least one of zinc oxide (ZnO) particles, titanium dioxide ($TiO_2$) particles, hollow silica particles provided therein with voids, silica particles provided therein with no voids, nano silicate particles, and porogen particles. In some embodiments, when the particles are hollow particles each having a hollow structure, that is, a shell, the diameter of each of the particles may be 20 nm to 200 nm, and the thickness of the shell may be 5 nm to 20 nm. The diameter of the hollow may be determined based on the thickness of the shell and the diameter of the particle. The refractive index of the first low refractive index layer 391 may be controlled by controlling the thickness of the shell and the diameter of the particle.

A second capping layer 353 may be on the first low refractive index layer 391. The second capping layer 353 may be cover the first low refractive index layer 391. The second capping layer 353 may prevent the damage or contamination of the first low refractive index layer 391 due to the penetration of impurities such as moisture and air from the outside. Further, the second capping layer 353 may prevent the particles included in the first low refractive index layer 391 from diffusing into another component. Moreover, the second capping layer 353 may encapsulate the first wavelength conversion pattern 341 and the second wavelength conversion pattern 343 together with the third capping layer 355 to be described later to prevent external air or moisture from penetrating into the first wavelength conversion pattern 341 and the second wavelength conversion pattern 343. In some embodiments, the second capping layer 353 may be made of an inorganic material. In some embodiments, the second capping layer 353 may include the same material as the first capping layer 351, or may include at least one of the materials exemplified in the description of the first capping layer 351.

The first wavelength conversion pattern 341 may be on the second capping layer 353 in the first light emitting region PA1. The first wavelength conversion pattern 341 may be in the first light emitting region PA1, and may not be in the second light emitting region PA2 and the third light emitting region PA3. The first wavelength conversion pattern 341 may convert or shift incident light of a specific peak wavelength into light of another specific peak wavelength and emit the light. In some embodiments, the first wavelength conversion pattern 341 may convert the first light L1, which is blue light, provided from the first organic light emitting element ED1 into red light having a wavelength range of 610 nm to 650 nm, and emit the red light.

In some embodiments, the first wavelength conversion pattern 341 may include a first base resin 3411 and first wavelength shifters 3413 dispersed in the first base resin 3411, and may further include first scatterers 3415 dispersed in the first base resin 3411.

The first base resin 3411 is not particularly limited as long as it has a high light transmittance and is excellent in dispersion characteristics for the first wavelength shifters 3413 and the first scatterers 3415. For example, the first base resin 3411 may include an organic material, e.g., an epoxy resin, an acrylic resin, a cardo resin, an imide resin, or the like. In some embodiments, the refractive index of the first base resin 3411 may be greater than the refractive index of the first low refractive index layer 391 by 0.3 or more.

The first wavelength shifters 3413 may convert or shift the peak wavelength of incident light to another specific peak wavelength. Examples of the first wavelength shifters 3413 may include quantum dots, quantum rods, and phosphors. For example, the quantum dots may be particulate matter that emits a specific color while electrons move from a conduction band to a valence band.

The quantum dot may be a semiconductor nanocrystalline material. The quantum dot has a specific band gap depending on its composition and size, and thus may absorb light and then emit light having an intrinsic wavelength. Examples of the semiconductor nanocrystals of the quantum dots include group IV nanocrystals, group II-VI compound nanocrystals, group III-V compound nanocrystals, group IV-VI nanocrystals, and combinations thereof.

Example of the group IV nanocrystals may include silicon (Si), germanium (Ge), or the like, and two-element compounds, e.g., silicon carbide (SiC), silicon-germanium (SiGe), or the like.

Example of the group II-VI compound nanocrystals may include two-element compounds, e.g., CdSe, CdTe, ZnS, ZnSe, ZnTe, ZnO, HgS, HgSe, HgTe, MgSe, MgS, and mixtures thereof; three-element compounds, e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and four-component compounds, e.g., HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

Example of the group III-V compound nanocrystals may include two-element compounds, e.g., GaN, GaP, GaAs, GaSb, AN, AlP, AlAs, AlSb, InN, InP, InAs, InSb, and mixtures thereof; three-element compounds, e.g., GaNP, GaNAs, GaNSb, GaPAs, GaPSb, AlNP, AlNAs, AlNSb, AlPAs, AlPSb, InNP, InNAs, InNSb, InPAs, InGaP, InPSb, GaAlNP, and mixtures thereof; and four-component compounds, e.g., GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

Example of the group IV-VI nanocrystals may include two-element compounds, e.g., SnS, SnSe, SnTe, PbS, PbSe, PbTe, and mixtures thereof; three-element compounds, e.g., SnSeS, SnSeTe, SnSTe, PbSeS, PbSeTe, PbSTe, SnPbS, SnPbSe, SnPbTe, and mixtures thereof; and four-component compounds, e.g., SnPbSSe, SnPbSeTe, SnPbSTe, and mixtures thereof.

In some embodiments, the quantum dot may have a core-shell structure including a core including the aforementioned nanocrystals and a shell surrounding the core. The shell of the quantum dot may prevent the chemical denaturation of the core to serve as a protective layer for maintaining semiconductor characteristics and/or a charging layer for imparting electrophoretic characteristics to the quantum dot. The shell may be a single layer or a multilayer. Examples of the shell of the quantum dot may include oxides of metals or nonmetals, semiconductor compounds, and combinations thereof.

Examples of the oxides of metals or nonmetals may include two-element compounds, e.g., $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; and three-element compounds, e.g., $MgAl_2O_4$, $CoFe_2O_4$, $NiFe_2O_4$, and $CoMn_2O_4$. Examples of the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InSb, AlAs, AlP, and AlSb.

The light emitted by the first wavelength shifter 3413 may have a light emission wavelength spectrum half band width of about 45 nm or less, or about 40 nm or less, or about 30 nm or less. Thus, the color purity and color reproducibility of the color displayed by the display device 1 can be further improved. Further, the light emitted by the first wavelength shifter 3413 may be emitted toward various directions regardless of the incident direction of incident light.

In some embodiments, the first wavelength shifter 3413 may convert the first light L1, e.g., blue light, provided from the first organic light emitting element ED1 into red light having a single peak wavelength in a range of about 610 nm to about 650 nm and then emit the red light. Part of the first light L1 provided from the first organic light emitting element ED1 may be transmitted and emitted through the first wavelength conversion pattern 341 without being converted into red light by the first wavelength shifter 3413. The component of the first light L1 incident on the first color filter 331 without being converted by the first wavelength conversion pattern 341 may be blocked by the first color filter 331. On the other hand, the red light of the first light L1 converted by the first wavelength conversion pattern 341 is transmitted through the first color filter 331 and emitted to the outside. Accordingly, the first outgoing light La emitted from the first light emitting region PA1 to outside of the display device 1 may be red light.

In some embodiments, the component of the first light L1 having been transmitted through the first color filter 331 without being converted by the first wavelength conversion pattern 341 may be reflected by the first low refractive index layer 391 and be incident on the first wavelength conversion pattern 341 again, and thus light conversion efficiency can be improved as described above.

In some embodiments, the sub-light L12, e.g., green light, as well as the first light L1, e.g., blue light, may be provided from the first organic light emitting element ED1 to the first wavelength conversion pattern 341. In this case, a part of the sub-light L12, which is green light, may be wavelength-converted by the first wavelength conversion pattern 341, or may be transmitted through the first wavelength conversion pattern 341 without being wavelength-converted by the first wavelength conversion pattern 341. The component of the sub-light L12, not wavelength-converted by the first wavelength conversion pattern 341, may be blocked by the first color filter 331. Thus, the first outgoing light La, e.g., red light, may be emitted.

The first scatterer 3415 has a refractive index different from that of the first base resin 3411, and may form an optical interface together with the first base resin 3411. For example, the first scatterer 3415 may be a light scattering particle. The first scatterer 3415 may be any material capable of scattering at least a part of transmitted light, e.g., a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), and zinc oxide (ZnO). Examples of the material of the organic particle may include an acrylic resin and a urethane resin.

The first scatterer 3415 may scatter light in a random direction regardless of the incident direction of the incident light without substantially changing the wavelength of the light transmitted through the first wavelength conversion pattern 341. Thus, the path length of light passing through the first wavelength conversion pattern 341 can be increased, and the color conversion efficiency by the first wavelength shifter 3413 can be increased.

In some embodiments, the thickness of the first wavelength conversion pattern 341 may be 3 μm to 15 μm. When the first wavelength conversion pattern 341 is formed to have a thickness of 3 μm or more, the color conversion efficiency of light transmitted through the first wavelength conversion pattern 341 can be improved. In some embodiments, the upper limit of the thickness of the first wavelength conversion pattern 341 may be about 15 μm in terms of ease of processing.

In some embodiments, the content of the first wavelength shifters 3413 included in the first wavelength conversion pattern 341 may be 10% to 60%. Further, the content of the first scatterers 3415 included in the first wavelength conversion pattern 341 may be 2% to 10%.

The second wavelength conversion pattern 343 may be on the second capping layer 353 in the second light emitting region PA2. The second wavelength conversion pattern 343 may be in the second light emitting region PA2, and may not be in the first light emitting region PA1 and the third light emitting region PA3. The second wavelength conversion pattern 343 may convert or shift incident light of a specific peak wavelength into light of another specific peak wavelength and emit the light. In some embodiments, the second wavelength conversion pattern 343 may convert the first sub-light L21, e.g., blue light, of the second light L2 provided from the second organic light emitting element ED2 into green light having a wavelength range of about 510 nm to about 550 nm and emit the green light.

In some embodiments, the second wavelength conversion pattern 343 may include a second base resin 3431 and second wavelength shifters 3433 dispersed in the second base resin 3431, and may further include second scatterers 3435 dispersed in the second base resin 3431.

The second base resin 3431 may be made of a material having high light transmittance. In some embodiments, the second base resin 3431 may be made of an organic material. In some embodiments, the second base resin 3431 may be made of the same material as the first base resin 3411, or may include at least one of the materials exemplified as the constituent materials of the first base resin 3411. In some embodiments, the refractive index of the second base resin 3431 may be greater than the refractive index of the first low refractive index layer 391 by 0.3 or more.

The second wavelength shifters 3433 may convert or shift the peak wavelength of incident light to another specific peak wavelength. In some embodiments, the second wavelength shifter 3433 may convert blue light having a peak wavelength in a range of 430 nm to 470 nm into green light having a peak wavelength in a range of 510 nm to 550 nm.

Examples of the second wavelength shifters 3433 may include quantum dots, quantum rods, and phosphors. Since a more detailed description of the second wavelength shifter 3433 is substantially the same as or similar to that described above in the description of the first wavelength shifter 3413, it will be omitted.

In some embodiments, both the first wavelength shifter 3413 and the second wavelength shifter 3433 may be made of quantum dots. In this case, the diameter of each of the quantum dots constituting the first wavelength shifter 3413 may be larger than the diameter of each of the quantum dots constituting the second wavelength shifter 3433.

The second scatterer 3435 has a refractive index different from that of the second base resin 3431, and may form an optical interface together with the second base resin 3431. For example, the second scatterer 3435 may be a light scattering particle. Since a detailed description of the second scatterer 3435 is substantially the same as or similar to the description of the first scatterer 3415, it will be omitted.

In some embodiments, the thickness of the second wavelength conversion pattern 343 may be 3 μm to 15 μm. When the second wavelength conversion pattern 343 is formed to have a thickness of 3 μm or more, the color conversion efficiency of light transmitted through the second wavelength conversion pattern 343 can be improved. In some embodiments, the upper limit of the thickness of the second wavelength conversion pattern 343 may be about 15 μm in terms of ease of processing.

In some embodiments, the content of the second wavelength shifters 3433 included in the second wavelength conversion pattern 343 may be 10% to 60%. Further, the content of the second scatterers 3435 included in the second wavelength conversion pattern 343 may be 2% to 10%.

The second light L21 and L22 emitted from the second organic light emitting element ED2 may be provided to the second wavelength conversion pattern 343, and the second wavelength shifter 3433 may convert the first sub-light L21, e.g., blue light, of the second light L2 provided from the second organic light emitting element ED2 into green light having a peak wavelength in a range of about 510 nm to about 550 nm and emit the green light.

A part of the first sub-light L21, e.g., blue light, may be transmitted and emitted through the first wavelength conversion pattern 341 without being converted into green light by the second wavelength shifter 3433, and may be blocked by the second color filter 333. On the other hand, the green light of the first sub-light L21, converted by the second wavelength conversion pattern 343, is transmitted through the second color filter 333 and emitted to the outside. Accordingly, the second outgoing light Lb emitted from the second light emitting region PA2 to the outside of the display device 1 may be green light.

Meanwhile, the second sub-light L22, e.g., green light, of the second light L2 of the second organic light emitting element ED2 is transmitted through the second wavelength conversion pattern 343 and the second color filter 333 and emitted to the outside without being wavelength-converted by the second wavelength shifter 3433.

In some embodiments, the light conversion efficiency of the second wavelength conversion pattern 343 for converting blue light into green light may be lower than the light conversion efficiency of the first wavelength conversion pattern 341 for converting blue light into red light. Therefore, even when the same amount of blue light is provided to the first wavelength conversion pattern 341 and to the second wavelength conversion pattern 343, the light amount of the second outgoing light Lb emitted from the second light emitting region PA2 may be less than the light amount of the first outgoing light La emitted from the first light emitting region PAL Thus, the color reproducibility of the display device may be deteriorated.

According to some embodiments, the second organic light emitting element ED2 emits green light as well as blue light, and the second sub-light L22, which is green light emitted from the second organic light emitting element ED2, is emitted to the outside of the second light emitting region PA2 together with the second outgoing light Lb, which is green light converted by the second wavelength conversion pattern 343. That is, the relatively small amount of green light may be supplemented by the second sub-light L22 which is green light emitted from the second organic light emitting element ED2. Thus, color reproducibility of the display device 1 may be improved.

In some embodiments, the component of the first sub-light L21, having passed through the second wavelength conversion pattern 343 without being converted by the second wavelength conversion pattern 343, may be reflected by the first low refractive index layer 391 and incident on the second wavelength conversion pattern 343 again, so that light conversion efficiency can be improved as described above.

The light transmitting pattern 345 may be on the second capping layer 353 in the third light emitting region PA3. The light transmitting pattern 345 may be in the third light emitting region PA3, and may not be in the first light region PA1 and the second light emitting region PA2. The light transmitting pattern 345 may transmit incident light.

In some embodiments, the light transmitting pattern 345 may include a third base resin 3451 and third scatterers 3455 dispersed in the third base resin 3451.

The third base resin 3451 may be made of a material having high light transmittance. In some embodiments, the third base resin 3451 may be made of an organic material. In some embodiments, the third base resin 3451 may be made of the same material as the first base resin 3411, or may include at least one of the materials exemplified as the constituent materials of the first base resin 3411. In some embodiments, the refractive index of the third base resin 3451 may be greater than the refractive index of the first low refractive index layer 391 by 0.3 or more.

The third scatterer 3455 has a refractive index different from that of the third base resin 3451, and may form an optical interface together with the third base resin 3451. For example, the third scatterer 3455 may be a light scattering particle. Since a detailed description of the third scatterer 3455 is substantially the same as or similar to the description of the first scatterer 3415, it will be omitted.

The third light L3, which is blue light provided from the third organic light emitting element ED3, is transmitted through the light transmitting pattern 345 and the third color filter 335 and is emitted to the outside. That is, the third outgoing light emitted in the third light emitting region PA3 may be the third light L3 emitted from the third organic light emitting element ED3.

A third capping layer 355 may be on the first wavelength conversion pattern 341 and the second wavelength conversion pattern 343. The third capping layer 355 may cover the first wavelength conversion pattern 341 and the second wavelength conversion pattern 343. In some embodiments, the third capping layer 355 may be on the light transmitting pattern 345, and may further cover the light transmitting pattern 345. The third capping layer 355 may encapsulate the first wavelength conversion pattern 341 and the second wavelength conversion pattern 343 together with the second capping layer 353. Thus, damage or contamination of the first wavelength conversion pattern 341 and the second wavelength conversion pattern 343 due to the penetration of impurities such as moisture and air from the outside, maybe reduced or prevented. In some embodiments, the third capping layer 355 may be made of an inorganic material. In some embodiments, the third capping layer 355 may be made of the same material as the first capping layer 351, or may include at least one of the materials exemplified in the description of the first capping layer 351.

In some embodiments, a protective layer 370 may be further on the third capping layer 355. The protective layer 370 may cover the third capping layer 355. In some embodiments, the protective layer 370 may be made of an inorganic material such as silicon oxide, silicon nitride, or silicon oxynitride. In other embodiments, the protective layer 370 may be omitted.

A second low refractive index layer 393 may be on the protective layer 370. The second low refractive index layer 393, similarly to the first low refractive index layer 391, may be over the first light emitting region PA1, the second light emitting region PA2, the third light emitting region PA3, and the non-light emitting region PB. In some embodiments, the second low refractive index layer 393 may have a lower refractive index than the first wavelength conversion pattern 341 and the second wavelength conversion pattern 343. For example, the second low refractive index layer 393 may have a refractive index of about 1.1 to about 1.4. In some embodiments, each of the refractive indexes of the first wavelength conversion pattern 341 and the second wavelength conversion pattern 343 may be larger than the refractive index of the second low refractive index layer 393 by 0.3 or more.

In some embodiments, the second low refractive index layer 393 may reflect a part of the light emitted in a direction from the first wavelength conversion pattern 341 and the second wavelength conversion pattern 343 to the first base portion 110 toward the first wavelength conversion pattern 341 and the second wavelength conversion pattern 343 again. That is, since the second low refractive index layer 393 may induce and recycle the light emitted toward the first base portion 110, of the blue light provided to the first wavelength conversion pattern 341 and the second wavelength conversion pattern 343, again, light utilization efficiency can be improved, and as a result, the light efficiency of the display device 1 can be improved.

Further, since the second low refractive index layer 393 may reflect light emitted toward the first base portion 110, of the light wavelength-converted by the first wavelength conversion pattern 341 and the second wavelength conversion pattern 343, toward the second base portion 310 again, the second low refractive index layer 393 can contribute to image display. Thus, light utilization efficiency can be improved, and display quality such as luminance of the display device 1 can be improved.

Moreover, since the second low refractive index layer 393 may reflect light emitted toward the first base portion 110, of the blue light incident on the light transmitting pattern 345, toward the second base portion 310 again, light utilization efficiency can be improved.

The filler 70 may be in the space between the second substrate 30 and the first substrate 10 as described above. In some embodiments, the filler 70 may be between the second low refractive index layer 393 and the thin film encapsulation layer 170.

Figure 13:
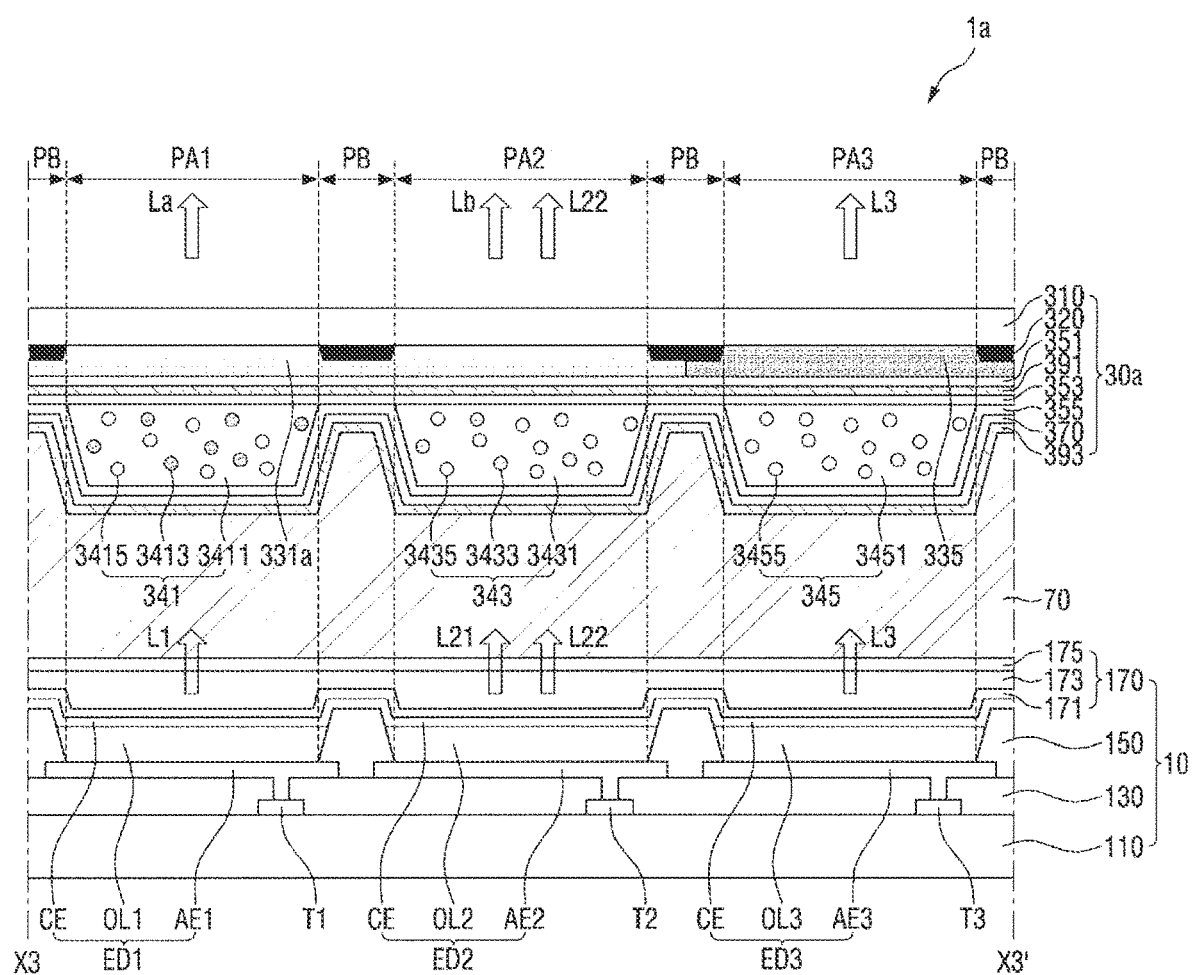
FIG. 13 illustrates a cross-sectional view of a display device according to another embodiment, taken along the line X3-X3' in FIG. 3.

FIG. 13 is a cross-sectional view of a display device according to another embodiment, taken along the line X3-X3' in FIG. 3. Referring to FIG. 13, a display device 1a according to this embodiment is the same as or similar to the display device 1 shown in FIG. 4, except that a configuration of a second substrate 30a of the display device 1a is different from the configuration of the second substrate 30 of the display device 1. Therefore, hereinafter, differences will be mainly described.

Unlike the second substrate 30 shown in FIG. 4, the second substrate 30a does not include the first color filter 331 and the second color filter 333, and may include a fourth color filter 331a.

The fourth color filter 331a may be over the first light emitting region PA1 and the second light emitting region PA2, and may cover the light blocking member between the first light emitting region PA1 and the second light emitting region PA2.

In some embodiments, the fourth color filter 331a may block or absorb light of the third color, e.g., blue light, and may selectively transmit light of the first color, e.g., red light, and light of the second color, e.g., green light. That is, the fourth color filter 331a may function as a blue light blocking filter for blocking blue light. In some embodiments, the fourth color filter 331a may be a yellow color filter, and may include a yellow colorant.

In some embodiments, the fourth color filter 331a may further include a gray colorant in addition to the yellow colorant. When the fourth color filter 331a further includes the gray colorant, it is possible to more effectively prevent the reflection of external light.

In some embodiments, the fourth color filter 331a may further include a blue colorant in addition to the yellow colorant. When the fourth color filter 331a further includes the blue colorant, it is possible to prevent a blue wavelength band component of external light from entering the first wavelength conversion pattern 341 and the second wavelength conversion pattern 343, and thus it is possible to prevent color-converted light from being emitted from the first wavelength conversion pattern 341 and the second wavelength conversion pattern 343 due to external light.

In some embodiments, the fourth color filter 331a may include both the gray colorant and the blue colorant in addition to the yellow colorant.

In some embodiments, when the second substrate 30a includes the fourth color filter 331a, the first organic light emitting element ED1 may emit only blue light, and may not green light. For example, the first organic light emitting element ED1 may include only a blue light emitting layer as a light emitting layer. This configuration is for preventing light other than red light, for example, green light, from being emitted from the first light emitting region PA1. When a separate structure capable of preventing green light from being emitted from the first light emitting region PA1 is provided, the first organic light emitting element ED1 may emit not only blue light but also green light.

Figure 14:
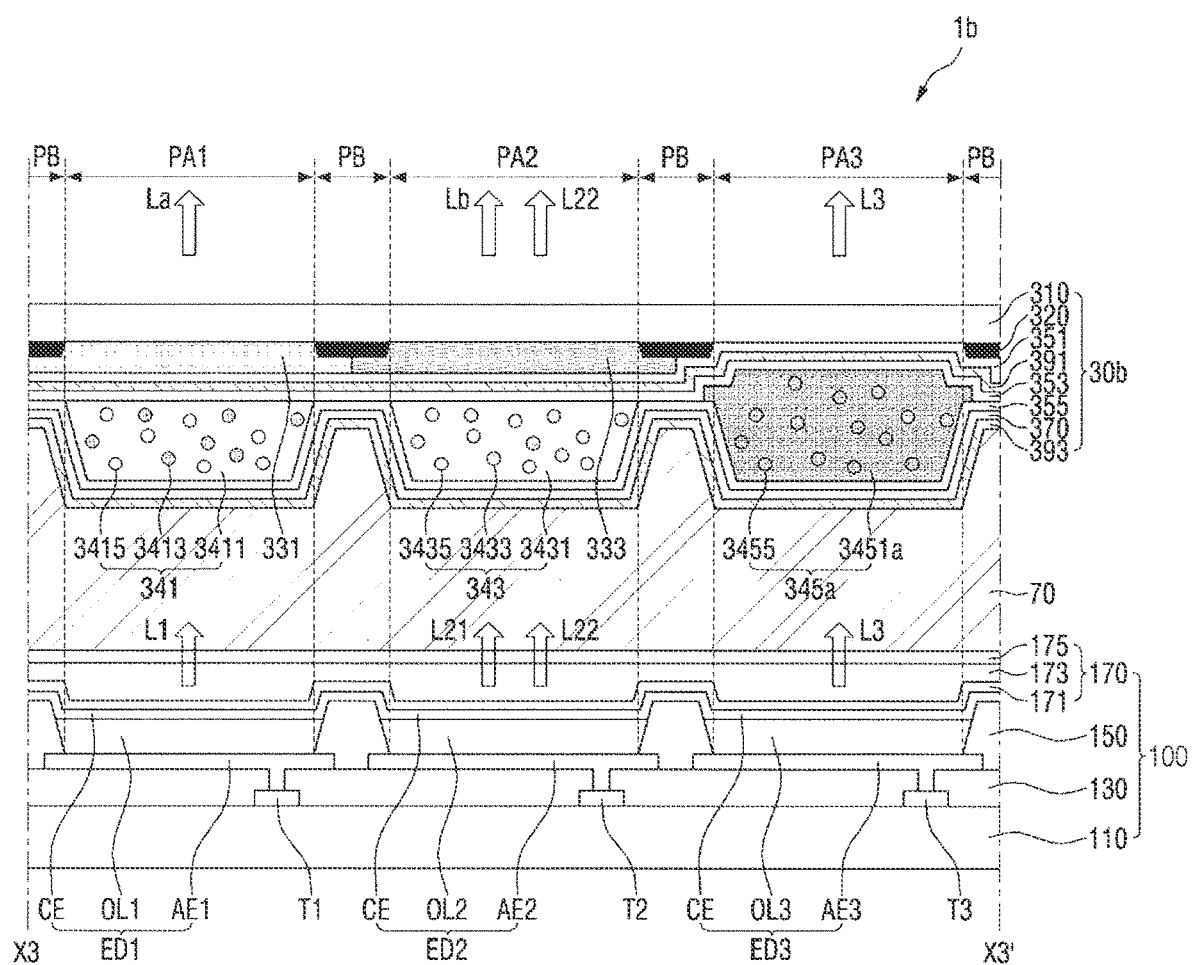
FIGS. 14 to 27 illustrate cross-sectional views of display devices according to other embodiments, taken along the line X3-X3' in FIG. 3.

FIG. 14 is a cross-sectional view of a display device according to still another embodiment, taken along the line X3-X3' in FIG. 3. Referring to FIG. 14, a display device 1b according to this embodiment is the same as or similar to the display device 1 shown in FIG. 4, except that a configuration of a second substrate 30b of the display device 1b is different from the configuration of the second substrate 30 of the display device 1. Therefore, hereinafter, differences will be mainly described.

Unlike the second substrate 30 shown in FIG. 4, the second substrate 30b does not include the third color filter 335, and may include a light transmitting pattern 345a. Unlike that shown in FIG. 4, since the second substrate 30b does not include the third color filter 335, in some embodiments, the first capping layer 351 may contact the light blocking member 320 and the second base portion 310.

The light transmitting pattern 345a may include a base resin 3451a and third scatterers 3455 dispersed in the base resin 3451a, and the base resin 3451a may include a blue colorant. For example, the base resin 3451a itself may be a blue color filter.

In some embodiments, the content of the third scatterers 3455 in the light transmitting pattern 345a may be 0.5 wt % to 10 wt %, and the content of the blue colorant in the light transmitting pattern 345a may be 1 wt % to 10 wt %. In some embodiments, the thickness of the light transmitting pattern 345a may be 3 μm to 13 μm, but is not limited thereto.

Figure 15:
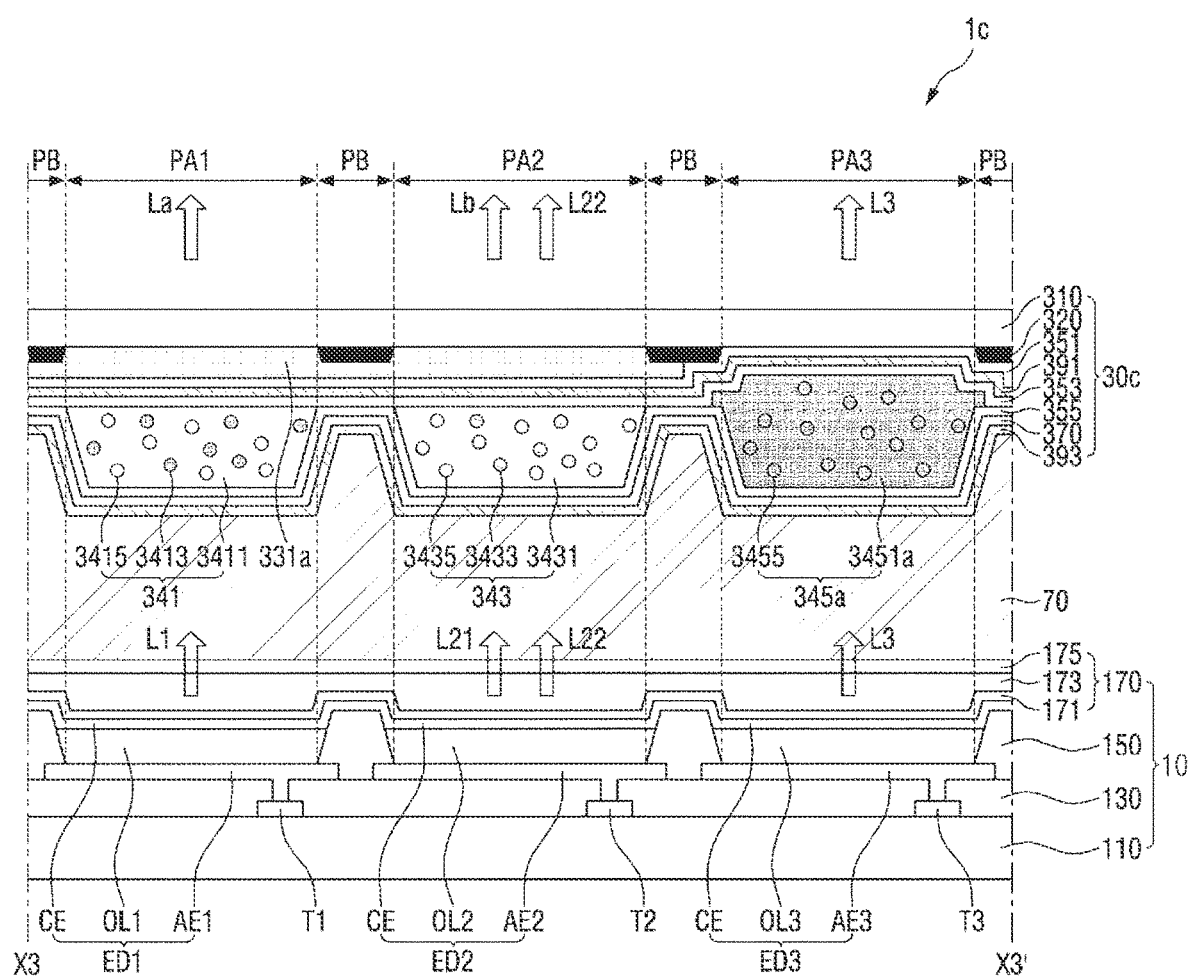

FIG. 15 is a cross-sectional view of a display device according to still another embodiment, taken along the line X3-X3' in FIG. 3. Referring to FIG. 15, a display device 1c according to this embodiment is the same as the display device 1b shown in FIG. 14, except that a second substrate 30c of the display device 1c does not include the first color filter 331 and the second color filter 333 but includes a fourth color filter 331a. Since a detailed description of the fourth color filter 331a is substantially the same as that having been described above with reference to FIG. 13, it will be omitted.

Figure 16:
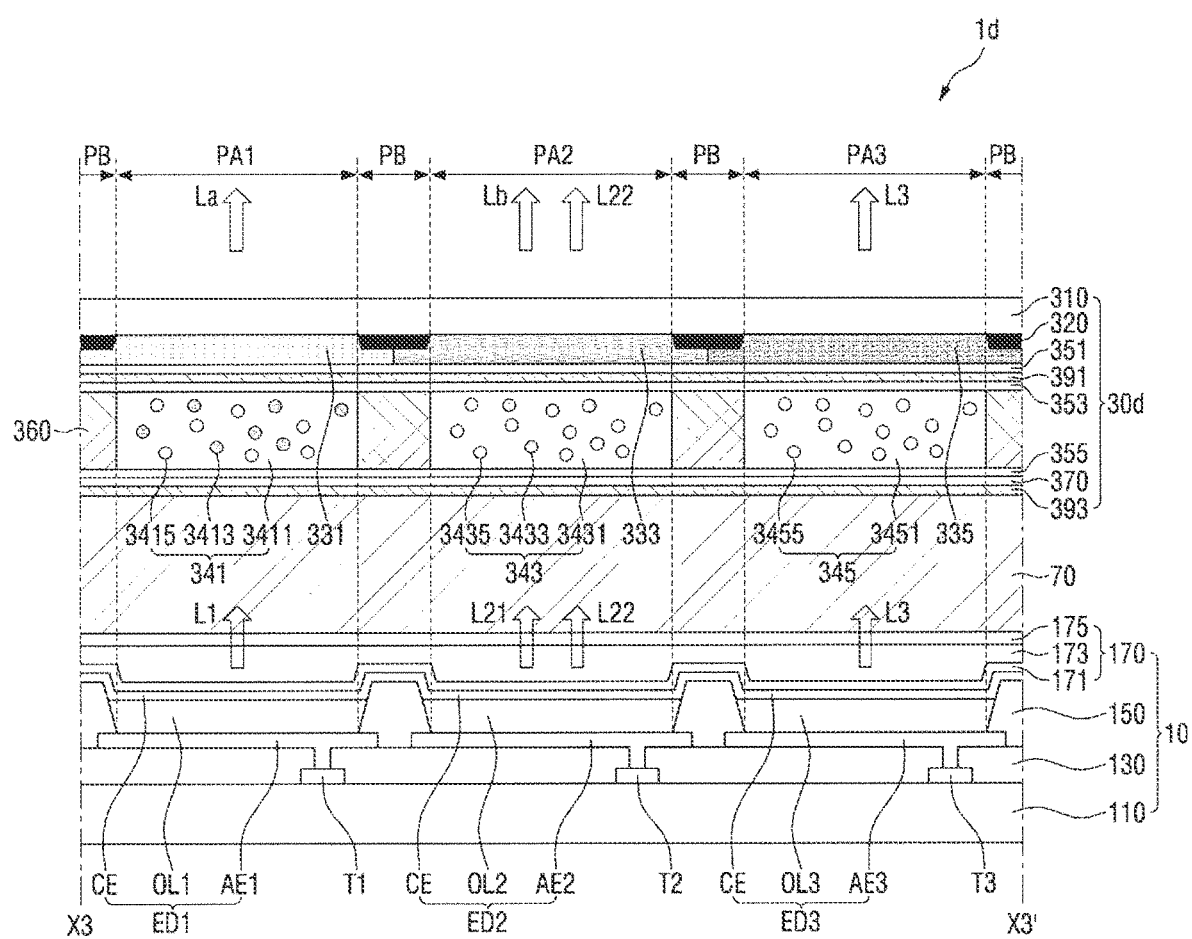

FIG. 16 is a cross-sectional view of a display device according to still another embodiment, taken along the line X3-X3' in FIG. 3. Referring to FIG. 16, a display device 1d according to this embodiment is substantially the same as the display device 1 shown in FIG. 4, except that a second substrate 30d of the display device 1d includes a partition wall 360.

The partition wall 360 may be between two adjacent light emitting regions. In some embodiments, the partition wall 360 may be in the non-light emitting region PB, and may be surround the first light emitting region PA1, the second light emitting region PA2, and the third light emitting region PA3. In some embodiments, the planar shape of the partition wall 360 may be a lattice shape.

When the first wavelength conversion pattern 341 and the second wavelength conversion pattern 343 are formed by an inkjet method using an ink composition, the partition wall 360 may serve as a guide for stably placing the ink composition for forming the first wavelength conversion pattern 341 and the second wavelength conversion pattern 343 at a desired position.

In some embodiments, the partition wall 360 may be translucent. The light transmittance of the partition wall 360 may be about 90% or more, about 95% or more, about 98% or more, or about 99% or more.

The material of the partition wall 360 may be a material having excellent light transmittance and may be an organic material, e.g., an epoxy resin or an acrylic resin. Specific examples of the organic material may include ethyleneglycol (meth)acrylate-based polymers, polyethyleneglycol di(meth)acrylate-based polymers, dimethylolpropane di(meth)acrylate-based polymers, trimethylolpropane tri (meth)acrylate-based polymers, pentaerythritol tri(meth) acrylate-based polymers, pentaerythritol tetra(meth)acrylate-based polymers, propylene glycol di(meth)acrylate-based polymers, dipentaerythritol penta(meth)acrylate-based polymers, dipentaerythritol hexa(meth)acrylate-based polymers, bisphenol A epoxy(meth)acrylate-based polymers, trisacryloyloxyethyl phosphate-based polymers, and cardoepoxy diacrylate-based polymers.

When the partition wall 360 is made of an organic material, the partition wall 360 may be made of a photosensitive organic material. The photosensitive organic material may be a negative photosensitive material in which curing occurs at a site irradiated with light.

In some embodiments, the partition wall 360 may be made of a material having a lower refractive index than the first wavelength conversion pattern 341 and the second wavelength conversion pattern 343. In this case, the partition wall 360 may have a function similar to that of the above-described first low refractive index layer 391 and second low refractive index layer 393.

In some embodiments, the partition wall 360 may extend between the second capping layer 353 and the third capping layer 355. In this case, the first wavelength conversion pattern 341 and the second wavelength conversion pattern 343 may directly contact the partition wall 360, e.g., sidewalls thereof. The light transmitting pattern 345 may also directly contact sidewalls of the partition wall 360. Alternatively or additionally, the partition wall 360 may extend between the first capping layer 351 and the light blocking member 320. When the partition wall 360 is only between the first capping layer 351 and the light blocking member 320, the first wavelength conversion pattern 341 and the second wavelength conversion pattern 343 may not directly contact the partition wall 360.

Figure 17:
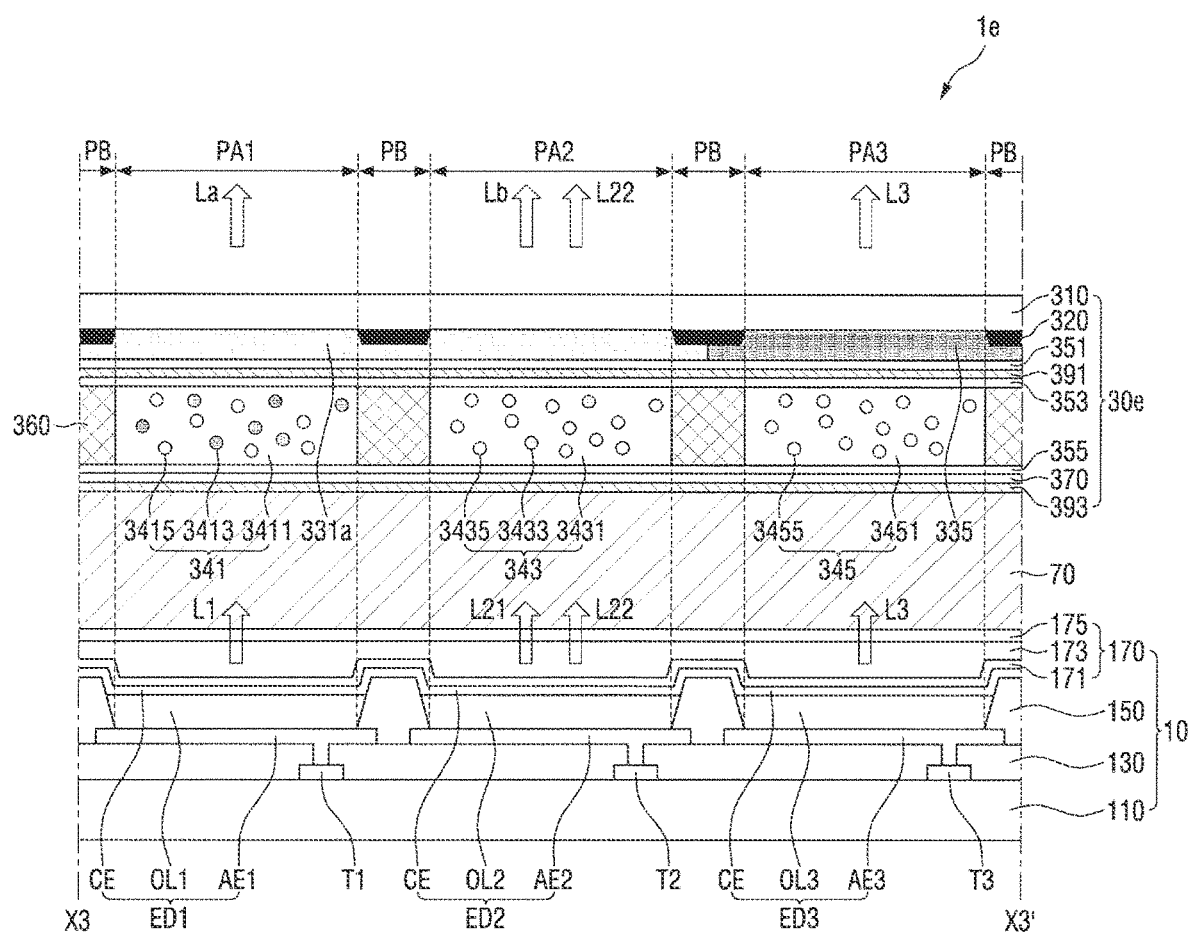
Figure 18:
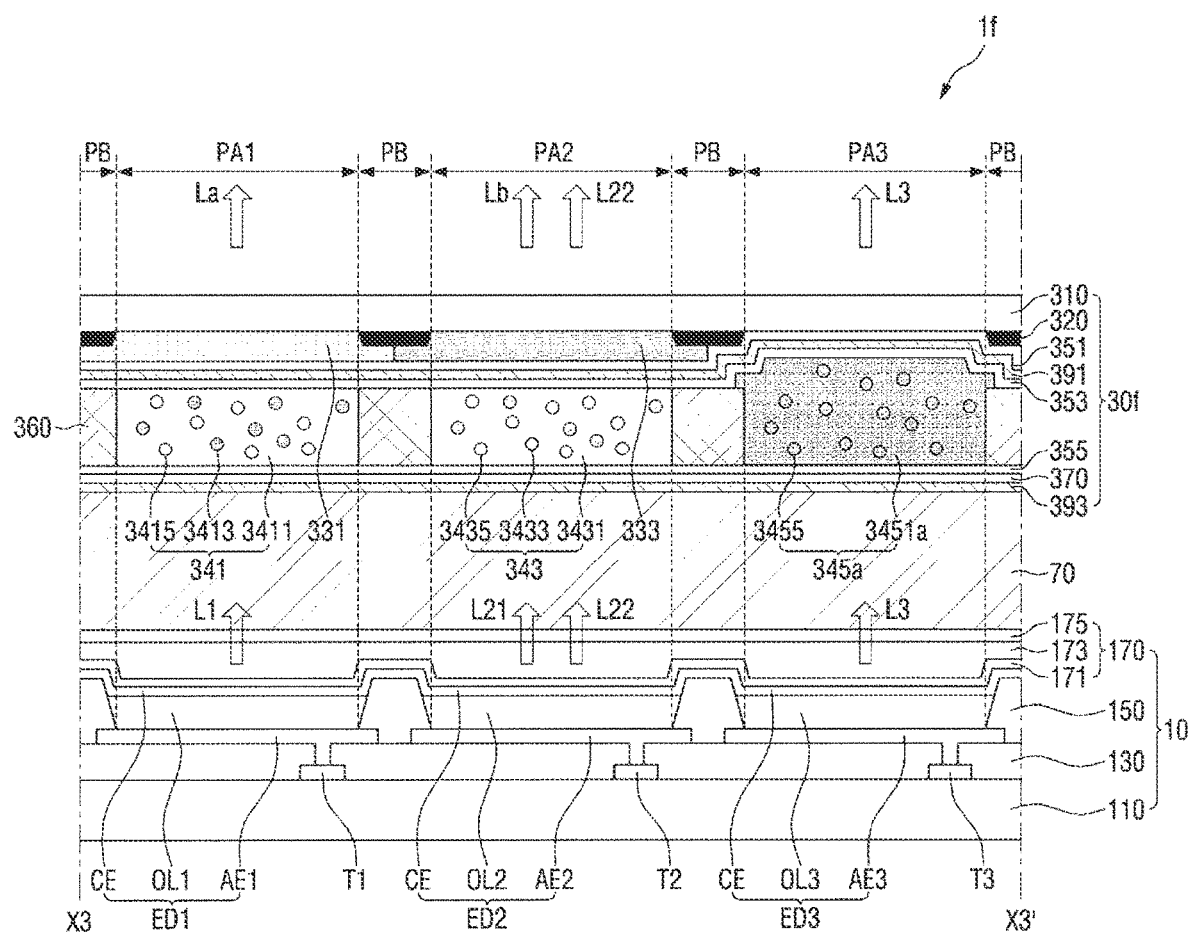
Figure 19:
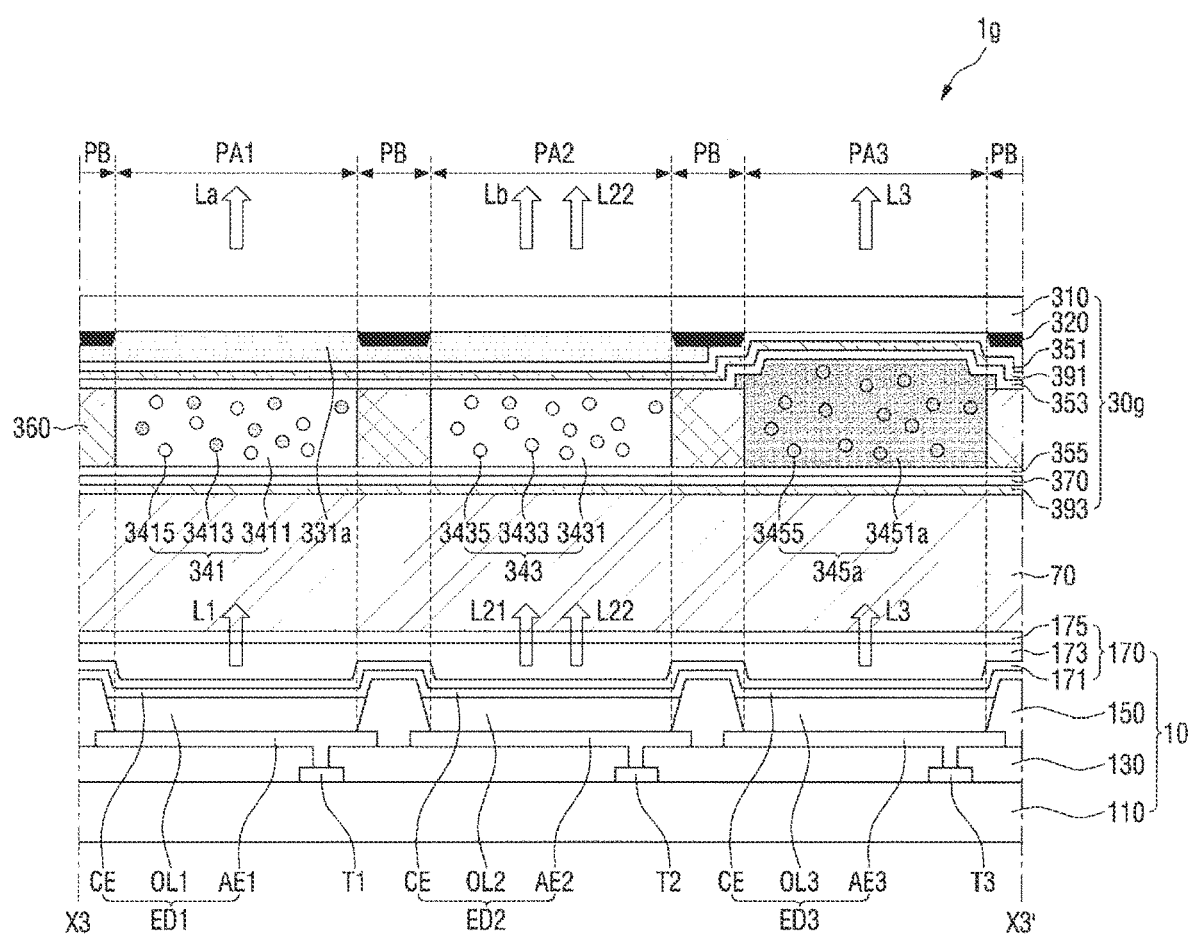

FIGS. 17 to 19 are cross-sectional views of display devices according to other embodiments, taken along the line X3-X3' in FIG. 3.

Referring to FIGS. 17 to 19, a display device 1e shown in FIG. 17 is substantially the same as the display device 1a shown in FIG. 13, except that a second substrate 30e of the display device 1e includes the partition wall 360. Further, a display device 1f shown in FIG. 18 is substantially the same as the display device 1b shown in FIG. 14, except that a second substrate 30f of the display device 1f includes the partition wall 360. Further, a display device 1g shown in FIG. 19 is substantially the same as the display device 1c shown in FIG. 15, except that a second substrate 30g of the display device 1g includes the partition wall 360. Since a description of the partition wall 360 is the same as that described above with reference to FIG. 16, it will be omitted.

Figure 20:
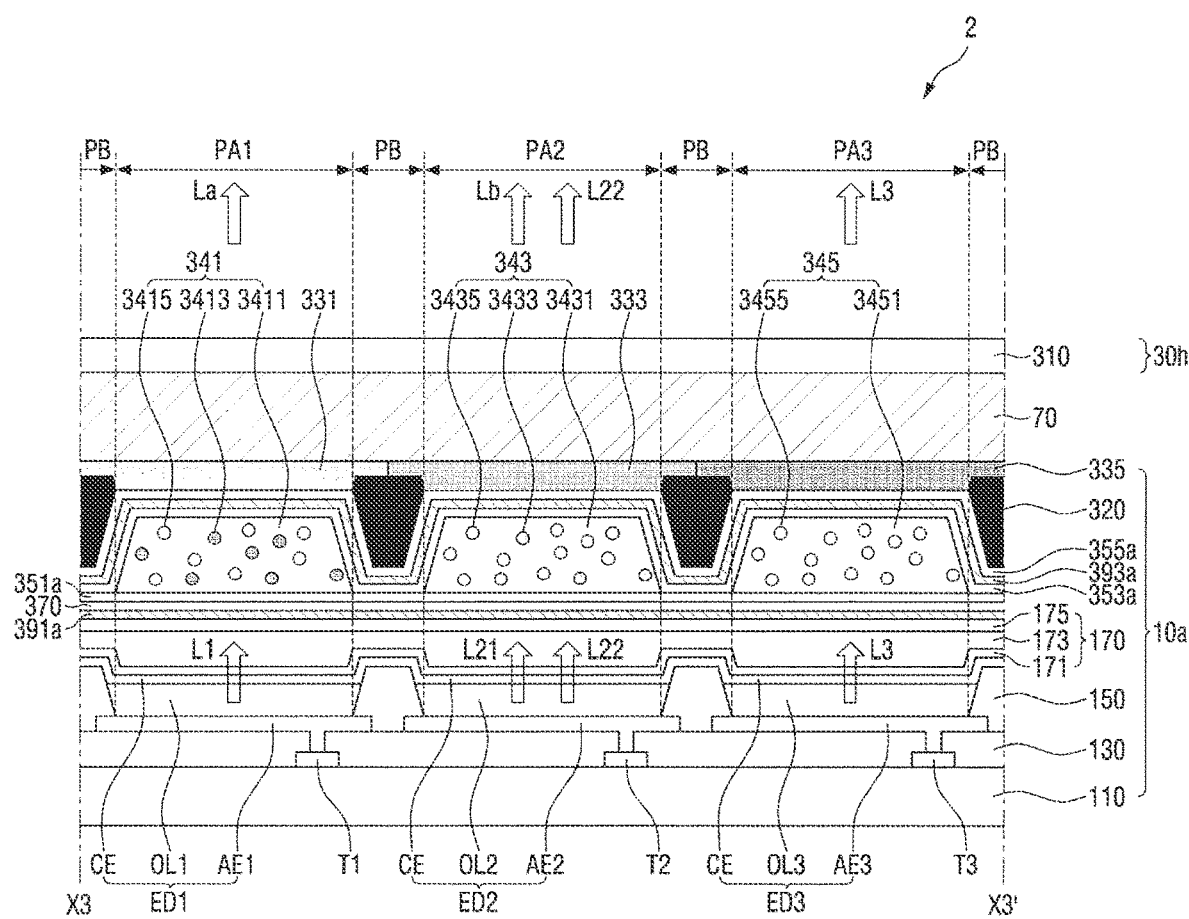

FIG. 20 is a cross-sectional view of a display device according to still another embodiment, taken along the line X3-X3' in FIG. 3. Referring to FIG. 20, a display device 2 according to this embodiment is the same as or similar to the display device 1 shown in FIG. 4, except that a first substrate 10a of the display device 2 includes other components of the second substrate 30 shown in FIG. 4 except for the second base portion 310, and that a second substrate 30h of the display device 2 includes only the second base portion 310 unlike the second substrate 30 of the display device 1. Therefore, hereinafter, differences will be mainly described.

Hereinafter, the first substrate 10a will be described. A first low refractive index layer 391a is on the thin film encapsulation layer 170. The refractive index of the first low refractive index layer 391a may be lower than the refractive index of the first wavelength conversion pattern 341 and the second wavelength conversion pattern 343. The first low refractive index layer 391a may have substantially the same function as the second low refractive index layer 393 of the display device 1 shown in FIG. 4. For example, the first low refractive index layer 391a may reflect light traveling in a direction from the first wavelength conversion pattern 341 and the second wavelength conversion pattern 343 toward the first base portion 110, and may provide the reflected light toward the first wavelength conversion pattern 341 and the second wavelength conversion pattern 343. Since a further detailed description of the first low refractive index layer 391a is substantially the same as the description of the second low refractive index layer 393 of the display device 1, it will be omitted.

A protective layer 370 may be on the first low refractive index layer 391a, and a first capping layer 351a may be on the protective layer 370. The first capping layer 351a may encapsulate the first wavelength conversion pattern 341 and the second wavelength conversion pattern 343 together with a second capping layer 353a to be described later. Since a further detailed description of the first capping layer 351a is substantially the same as or similar to the description of the third capping layer 355 of the display device 1, it will be omitted.

The first wavelength conversion pattern 341 may be on the first capping layer 351a in the first light emitting region PA1, and the second wavelength conversion pattern 343 may be on the first capping layer 351a in the second light emitting region PA2. Further, the light transmitting pattern 345 may be on the first capping layer 351a in the third light emitting region PA3.

The second capping layer 353a may be on the first wavelength conversion pattern 341, the second wavelength conversion pattern 343, and the light transmitting pattern 345. The second capping layer 353a may encapsulate the first wavelength conversion pattern 341 and the second wavelength conversion pattern 343 together with the first capping layer 351a. Since a further detailed description of the second capping layer 353a is substantially the same as or similar to the description of the second capping layer 353 of the display device 1, it will be omitted.

A second low refractive index layer 393a is on the second capping layer 353a. The refractive index of the second low refractive index layer 393a may be lower than the refractive index of the first wavelength conversion pattern 341 and the second wavelength conversion pattern 343. The second low refractive index layer 393a may have substantially the same function as the first low refractive index layer 391 of the display device 1 shown in FIG. 4. For example, the second low refractive index layer 393a may reflect light traveling in a direction toward the second base portion 310, of the light not converted by the first wavelength conversion pattern 341 and the second wavelength conversion pattern 343, and may make the reflected light incident on the first wavelength conversion pattern 341 and the second wavelength conversion pattern 343 again. Since a further detailed description of the second low refractive index layer 393a is substantially the same as the description of the first low refractive index layer 391 of the display device 1, it will be omitted.

A third capping layer 355a may be on the second low refractive index layer 393a. The third capping layer 355a may cover the second low refractive index layer 393a. Since a further detailed description of the third capping layer 355a is substantially the same as the description of the first capping layer 351 of the display device 1, it will be omitted.

In some embodiments, the light blocking member 320 may be on the third capping layer 355a. The light blocking member 320 may be in the non-light emitting region PB, and may not be in the first light emitting region PA1, the second light emitting region PA2, and the third light emitting region PA3.

The first color filter 331 may be on the third capping layer 355a in the first light emitting region PA1, the second color filter 333 may be on the third capping layer 355a in the second light emitting region PA2, and the third color filter 335 may be on the third capping layer 355a in the third light emitting region PA3.

A second substrate 30h may include the second base portion 310 and a filler 70 may be between the first substrate 10a and the second substrate 30h. In some embodiments, the filler 70 may be between the first color filter 331 and the second base portion 310, between the second color filter 333 and the second base portion 310, and between the third color filter 335 and the second base portion 310. In the case of the display device 2 according to this embodiment, there is an advantage of reducing an alignment tolerance between components in each light emitting region (for example, an alignment tolerance between the organic light emitting element and the wavelength conversion pattern or an alignment tolerance between the pixel defining film and the light blocking member).

Figure 21:
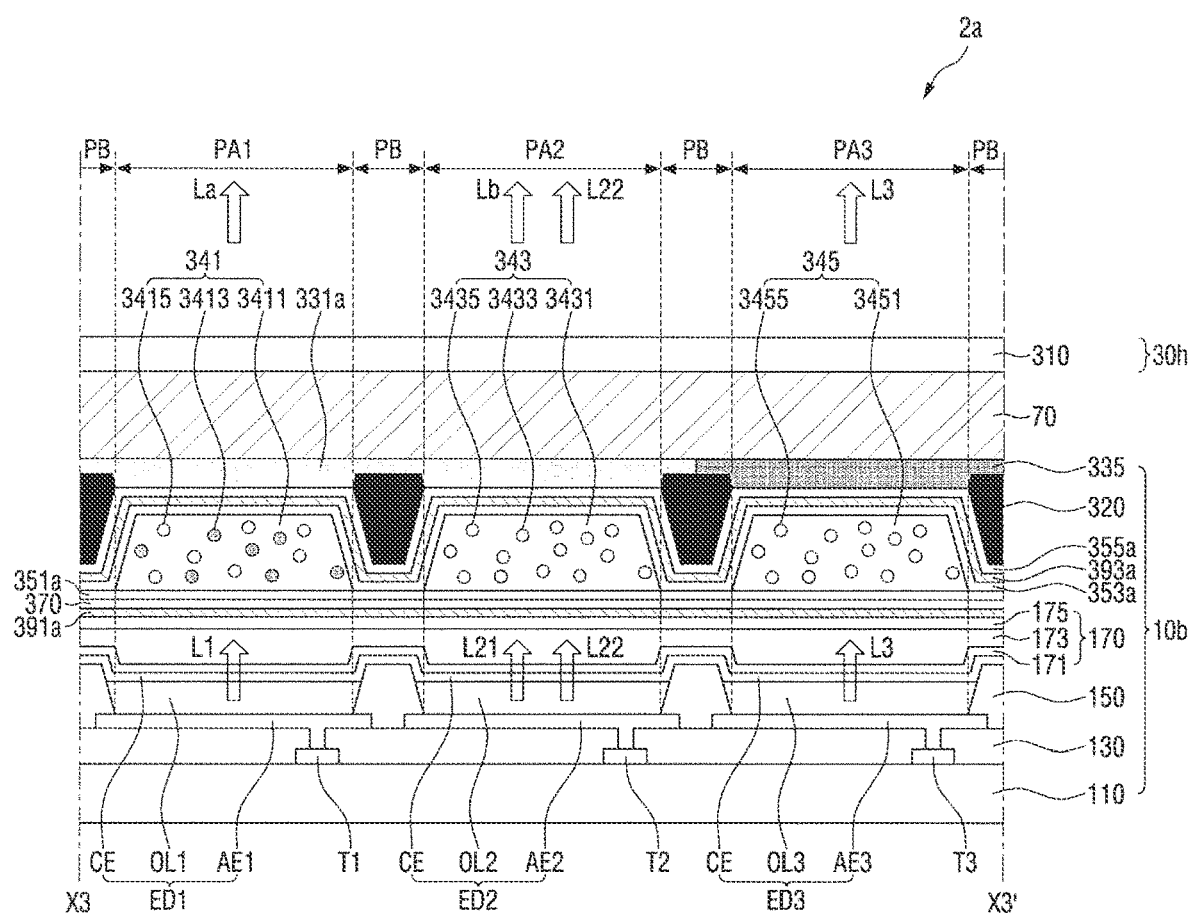

FIG. 21 is a cross-sectional view of a display device according to still another embodiment, taken along the line X3-X3' in FIG. 3. Referring to FIG. 21, a display device 2a according to this embodiment is substantially the same as the display device 2 shown in FIG. 20, except that a first substrate 10b of the display device 2a does not the first color filter 331 and the second color filter 333, but includes a fourth color filter 331a unlike the first substrate 10a of the display device 2 of FIG. 20. Since a detailed description of the fourth color filter 331a is substantially the same as that described above with reference to FIG. 13, it will be omitted.

Figure 22:
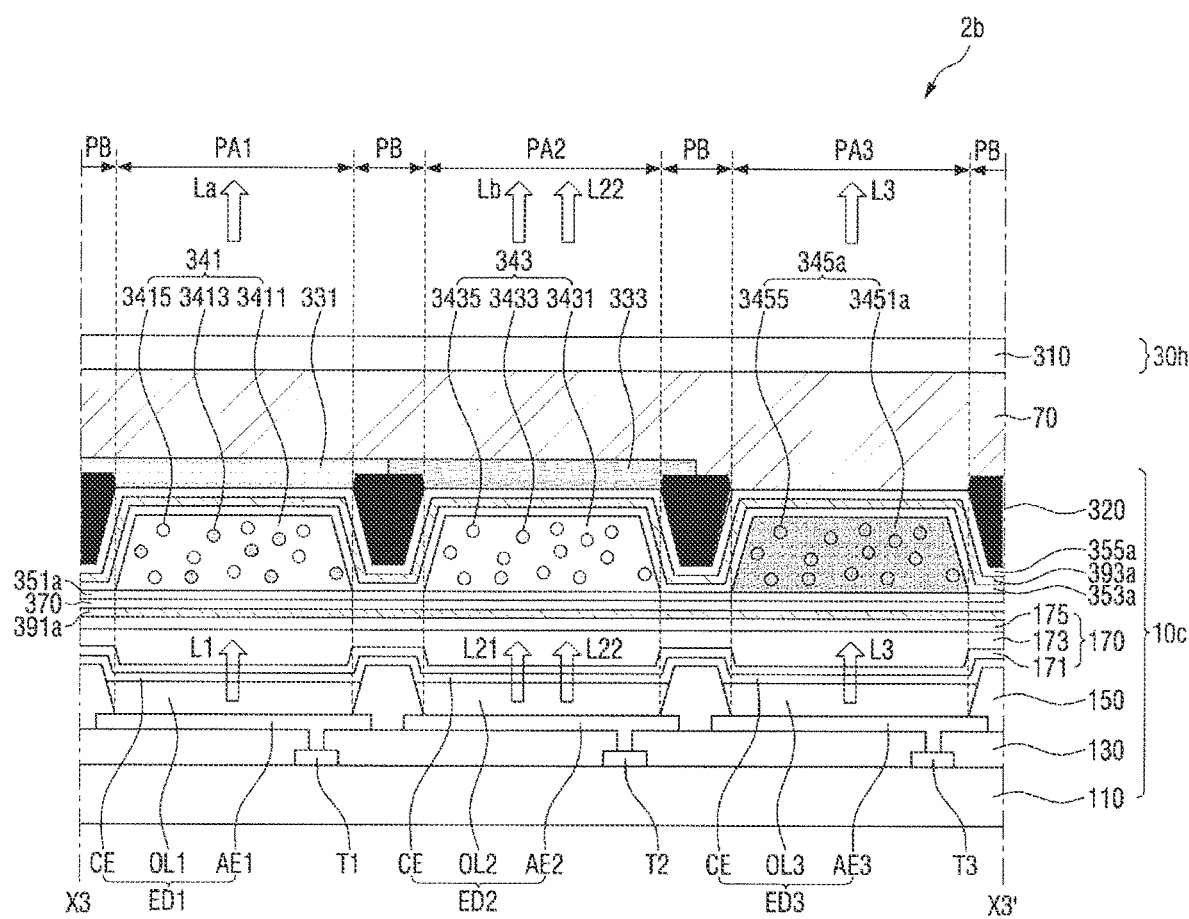

FIG. 22 is a cross-sectional view of a display device according to still another embodiment, taken along the line X3-X3' in FIG. 3. Referring to FIG. 22, a display device 2b according to this embodiment is different from the display device 2 shown in FIG. 20 in that a first substrate 10c of the display device 2b may not include the third color filter 335 and may include a light transmitting pattern 345a instead of the light transmitting pattern 345, unlike the first substrate 10a of the display device 2. When the third color filter 335 is omitted, the filler 70 may contact the light blocking member 320 and the third capping layer 355a.

As described above in the description of FIG. 14, the light transmitting pattern 345a may include a base resin 3451a and third scatterers 3455 dispersed in the base resin 3451a, and the base resin 3451a may include a blue colorant. For example, the base resin 3451a itself may be a blue color filter. Since a detailed description of the light transmitting pattern 345a is substantially the same as that described above with reference to FIG. 14, it will be omitted.

Figure 23:
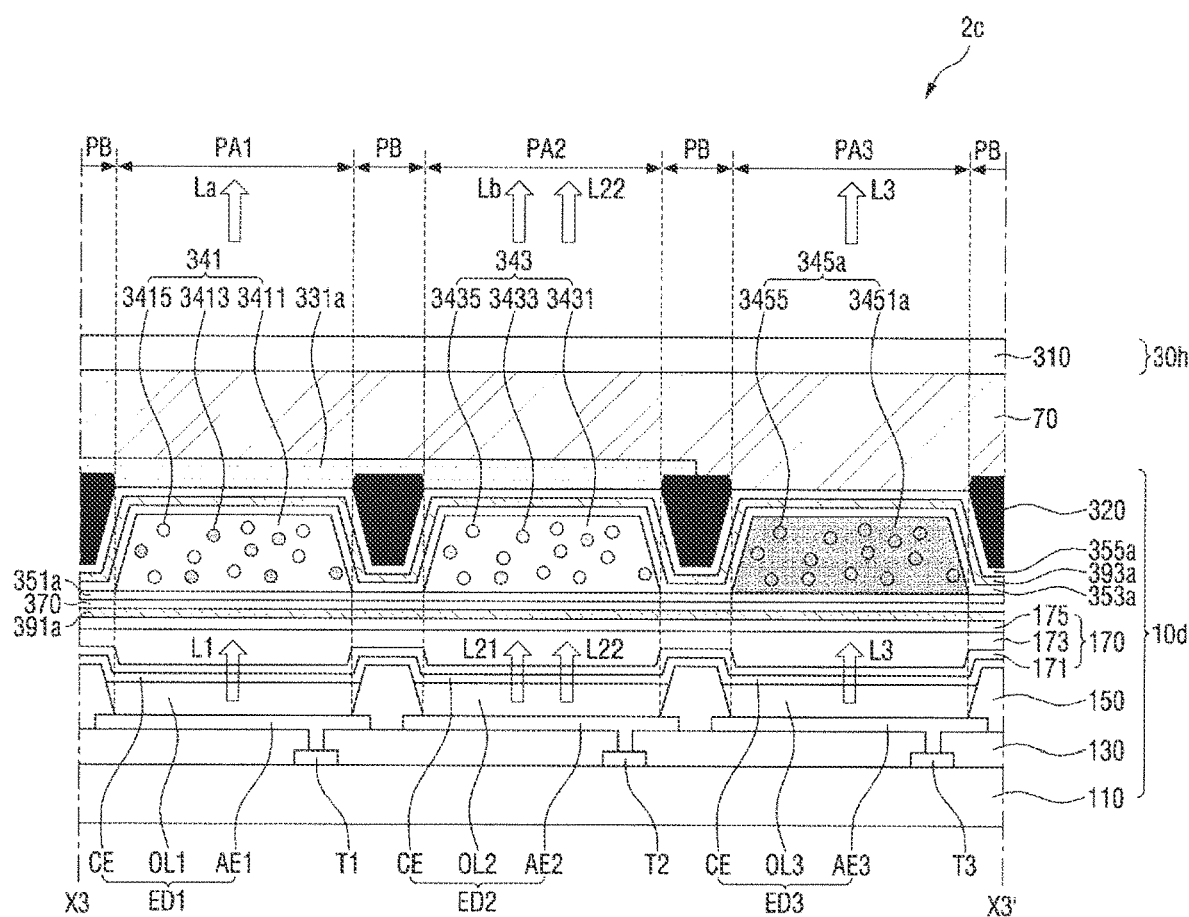

FIG. 23 is a cross-sectional view of a display device according to still another embodiment, taken along the line X3-X3' in FIG. 3. Referring to FIG. 23, a display device 2c according to this embodiment is substantially the same as the display device 2b shown in FIG. 22, except that a first substrate 10d of the display device 2c does not the first color filter 331 and the second color filter 333, but includes a fourth color filter 331a. Since a detailed description of the fourth color filter 331a is substantially the same as that described above with reference to FIG. 13, it will be omitted.

Figure 24:
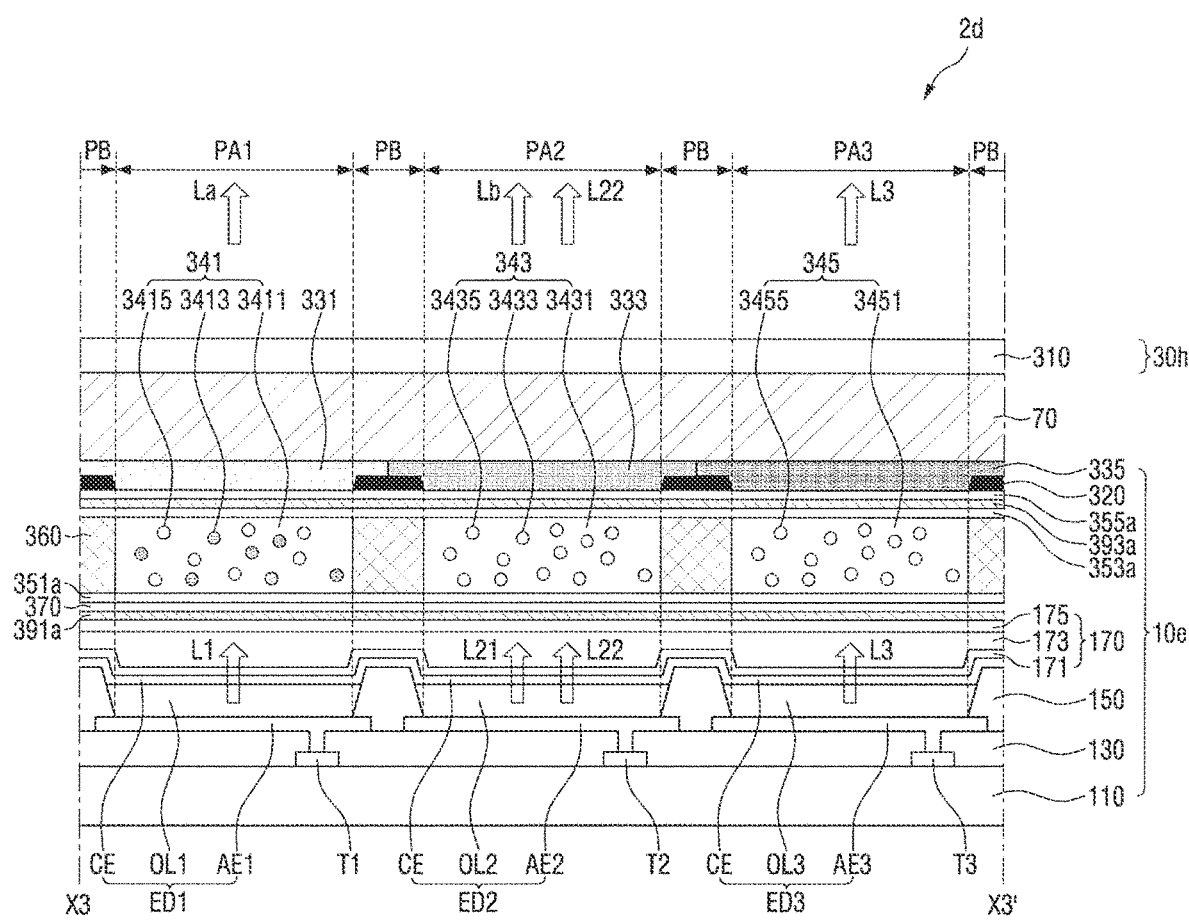

FIG. 24 is a cross-sectional view of a display device according to still another embodiment, taken along the line X3-X3' in FIG. 3. Referring to FIG. 24, a display device 2d according to this embodiment is substantially the same as the display device 2 shown in FIG. 20, except that a first substrate 10e of the display device 2d includes the partition wall 360.

The partition wall 360 may be between two adjacent light emitting regions. In some embodiments, as described above with reference to FIG. 16, the partition wall 360 may be in the non-light emitting region PB, and may be surround the first light emitting region PA1, the second light emitting region PA2, and the third light emitting region PA3.

In some embodiments, as shown in FIG. 24, the partition wall 360 may be on the first capping layer 351a, and the second capping layer 353a may be on the partition wall 360. In another embodiment, the partition wall 360 may be between the first capping layer 351a and the thin film encapsulation layer 170. Illustratively, the partition wall may be between the first capping layer 351a and the protective layer 370 or between the first low refractive index layer 391a and the protective layer 370. Since a detailed description of the partition wall 360 is substantially the same as that described above with reference to FIG. 16, it will be omitted.

Figure 25:
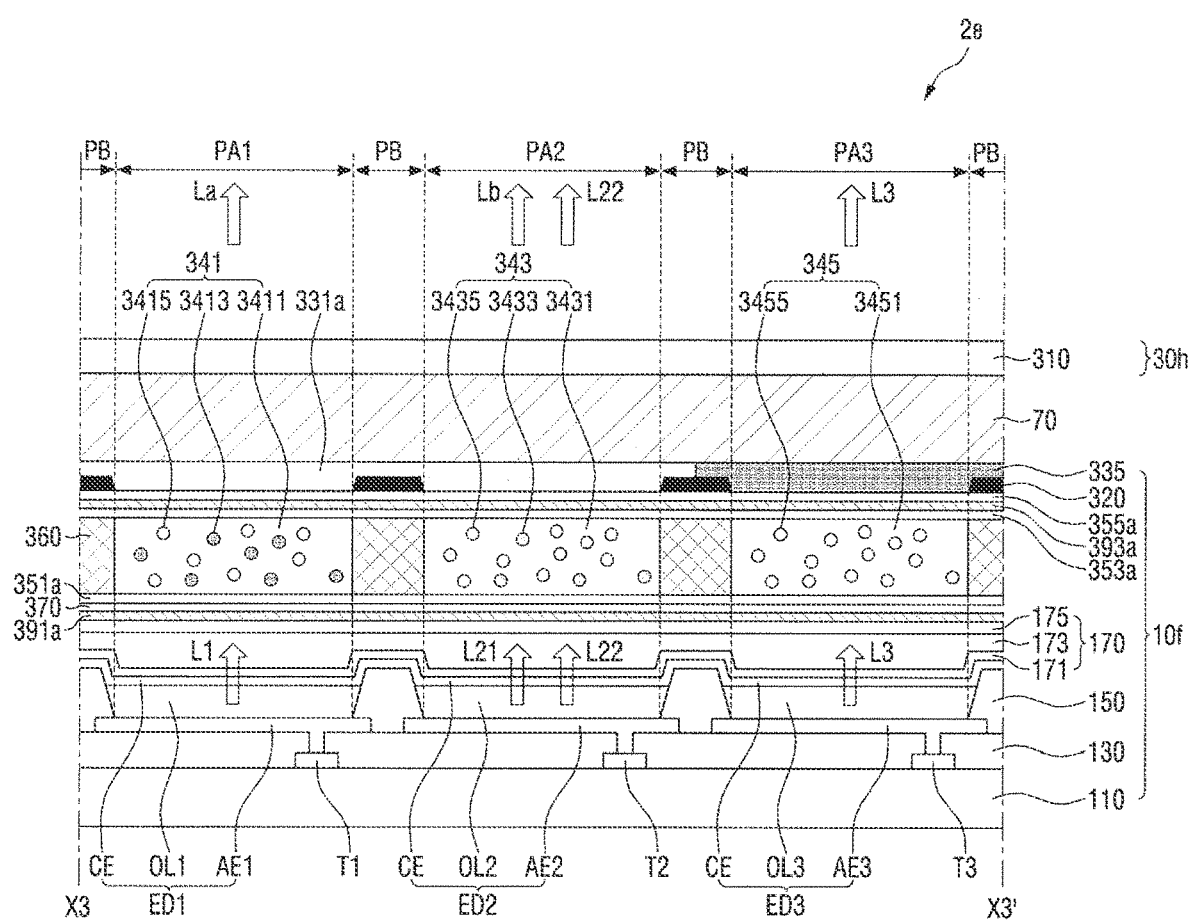
Figure 26:
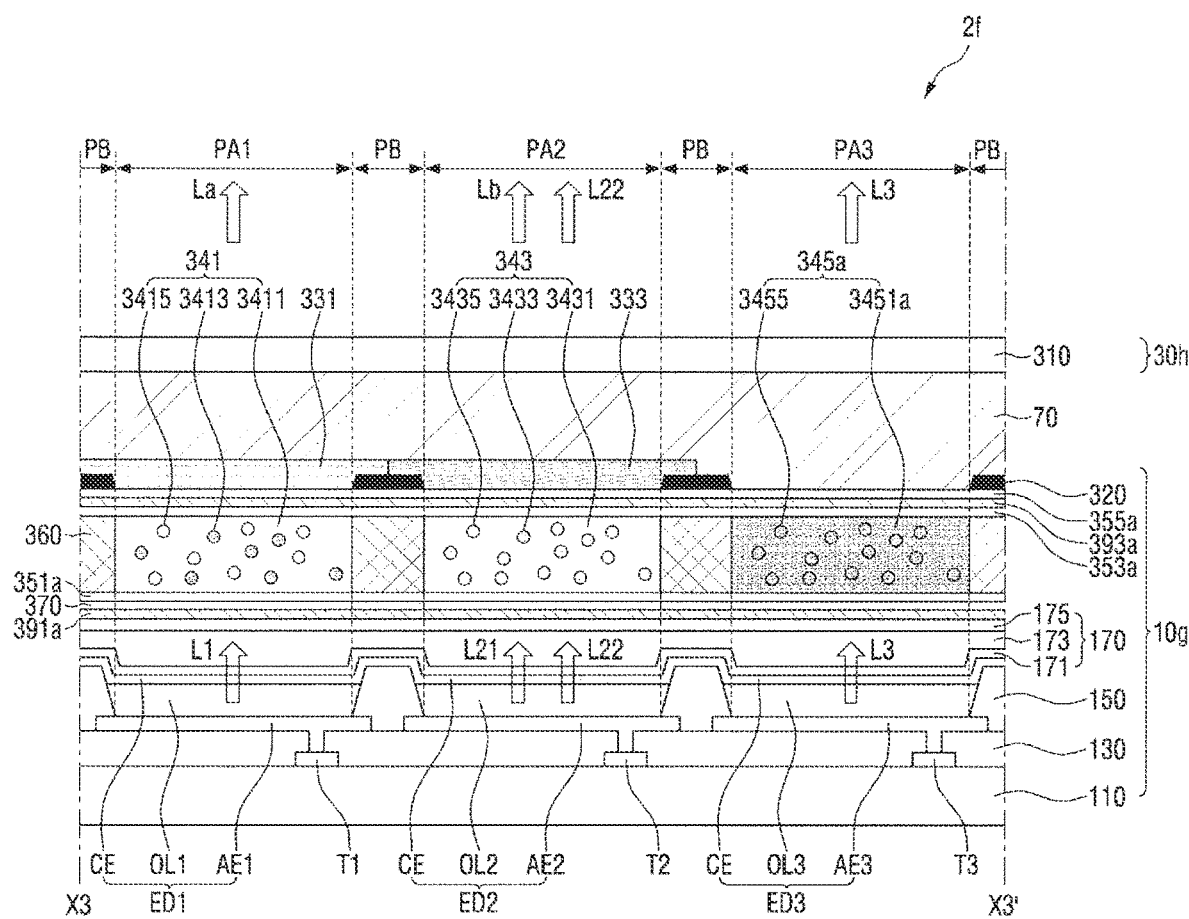
Figure 27:
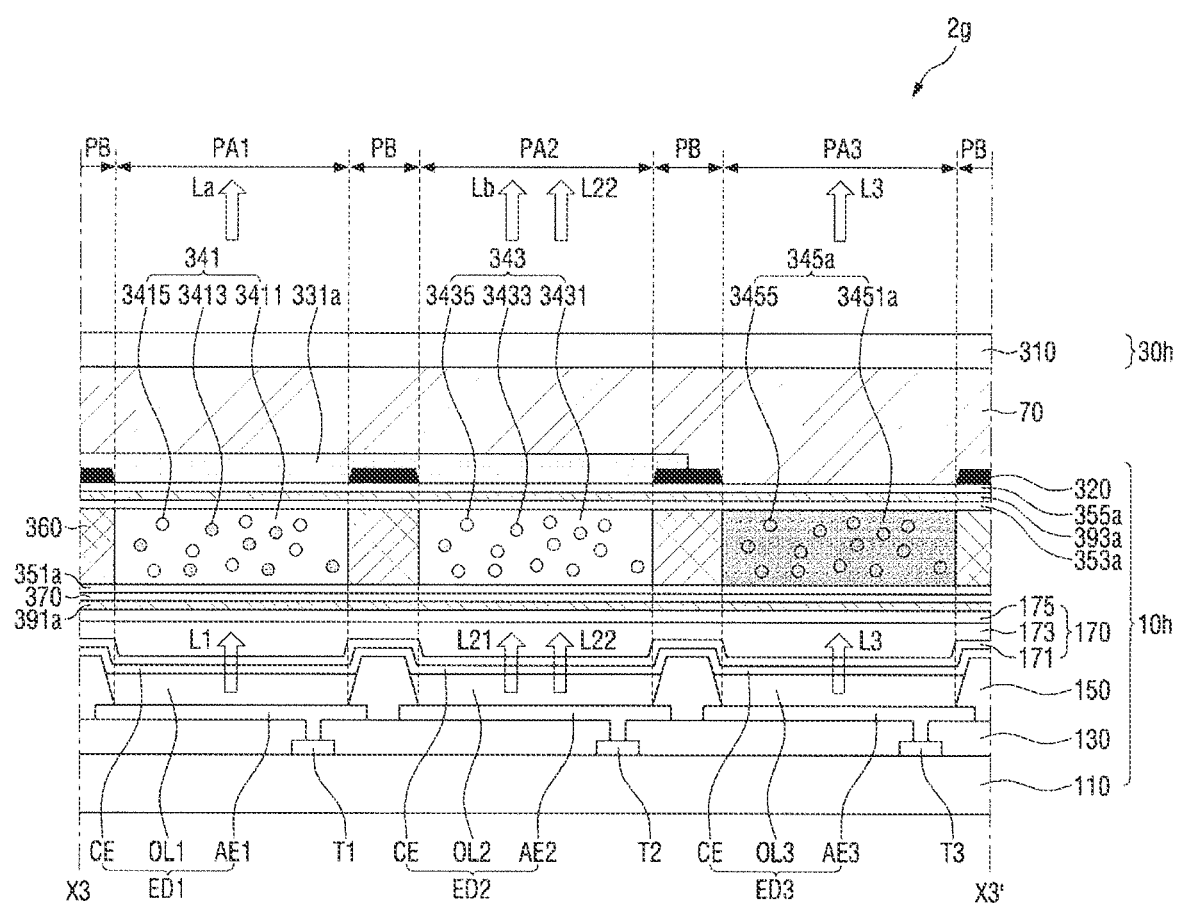

FIGS. 25 to 27 are cross-sectional views of display devices according to other embodiments, taken along the line X3-X3' in FIG. 3. Referring to FIGS. 25 to 27, a display device 2e shown in FIG. 25 is substantially the same as the display device 2a shown in FIG. 21, except that a first substrate 10f of the display device 2e includes the partition wall 360. Further, a display device 2f shown in FIG. 26 is substantially the same as the display device 2b shown in FIG. 22, except that a first substrate 10g of the display device 2f includes the partition wall 360. Further, a display device 2g shown in FIG. 27 is substantially the same as the display device 2c shown in FIG. 23, except that a first substrate 10h of the display device 2g includes a partition wall 360. Since a description of the partition wall 360 is the same as that described above with reference to FIGS. 16 and 24, it will be omitted.

The display device according to the aforementioned embodiments may compensate for the difference in light amount of each color caused by the difference in the light conversion efficiency of the wavelength conversion pattern with the light emitted from the organic light emitting element. Accordingly, the difference in the amount of emitted light for each color can be reduced, and as a result, the color reproducibility and display quality of the display device can be improved.

As described above, according to the embodiments, a display device having improved luminance and color reproducibility may be realized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a substrate including a first light emitting region;
a first electrode disposed on the substrate, the first electrode overlapping the first light emitting region;
a layer on the first electrode, the layer including a first light emitting layer, a second light emitting layer overlapping the first light emitting layer, and a third light emitting layer overlapping the first light emitting layer and the second light emitting layer;
a second electrode on the layer;
a wavelength conversion pattern on the second electrode, overlapping the first light emitting region and wavelength-converting blue light into green light;
a first color filter on the wavelength conversion pattern; and
an inorganic layer disposed between the wavelength conversion pattern and the first color filter, wherein any one of the first light emitting layer, the second light emitting layer, and the third light emitting layer emits green light,
other two of the first light emitting layer, the second light emitting layer, and the third light emitting layer emit blue light, and
the wavelength conversion pattern comprises quantum dots and scatterers.

2. The display device of claim 1, further comprising:
a first refractive layer disposed between the wavelength conversion pattern and the first color filter, wherein
the first refractive layer overlaps the inorganic layer.

3. The display device of claim 2, wherein the first refractive layer has a lower refractive index than the wavelength conversion pattern.

4. The display device of claim 3, wherein a difference between the refractive index of the wavelength conversion pattern and the refractive index of the first refractive layer is 0.3 or more.

5. The display device of claim 3, further comprising:
a second refractive layer between the wavelength conversion pattern and the second electrode, the second refractive layer having a lower refractive index than the wavelength conversion pattern.

6. The display device of claim 2, wherein the first refractive layer directly contacts the inorganic layer.

7. The display device of claim 1, wherein
the layer on the first electrode further includes a fourth light emitting layer overlapping the first light emitting layer, the second light emitting layer and the third light emitting layer, and
the fourth light emitting layer emits the blue light.

8. The display device of claim 1, wherein
the substrate further includes a second light emitting region, and
the display device further comprises a light transmitting pattern on the second electrode and overlapping the second light emitting region.

9. The display device of claim 8, wherein the first color filter overlaps the layer, transmits the green light and blocks the blue light.

10. The display device of claim 9, further comprising:
a second color filter on the light transmitting pattern, transmitting the blue light, and blocking the green light and red light.

11. The display device of claim 10, wherein the inorganic layer is between the light transmitting pattern and the second color filter.

12. The display device of claim 10, wherein
a portion of the first color filter and a portion of the second color filter are disposed in a non-light emitting region, and
the non-light emitting region is disposed between the first light emitting region and the second light emitting region.

13. The display device of claim 8, wherein the light transmitting pattern includes:
a base resin; and
scatterers dispersed in the base resin.

14. The display device of claim 13, wherein the light transmitting pattern further includes a colorant which is configured to transmit the blue light and block the green light and red light.

15. The display device of claim 8, further comprising:
a partition wall between the wavelength conversion pattern and the light transmitting pattern, wherein a side surface of the partition wall contacts the wavelength conversion pattern.

16. The display device of claim 1, further comprising:
a filler disposed on the second electrode and overlapping the wavelength conversion pattern.

17. The display device of claim 16, further comprising:
an insulation layer on the second electrode, wherein
the filler is disposed between the insulation layer and the wavelength conversion pattern.

18. The display device of claim 16, further comprising:
an insulation layer on the second electrode, wherein
the wavelength conversion pattern is disposed between the filler and the insulation layer.

19. The display device of claim 1, wherein the layer does not include a light emitting layer for emitting red light.

* * * * *